(12) United States Patent
Lin et al.

(10) Patent No.: US 8,692,374 B2
(45) Date of Patent: Apr. 8, 2014

(54) CARBON NANOTUBE CIRCUIT COMPONENT STRUCTURE

(75) Inventors: Mou-Shiung Lin, Hsin-Chu (TW); Chien-Kang Chou, Tainan (TW); Hsin-Jung Lo, Taipei (TW)

(73) Assignee: Megit Acquisition Corp., San Diego, CA (US)

( * ) Notice: Subject to any disclaimer, the term of this patent is extended or adjusted under 35 U.S.C. 154(b) by 0 days.

(21) Appl. No.: 13/180,479

(22) Filed: Jul. 11, 2011

(65) Prior Publication Data

US 2011/0266680 A1    Nov. 3, 2011

Related U.S. Application Data

(63) Continuation of application No. 11/563,215, filed on Nov. 27, 2006, now Pat. No. 7,990,037.

(60) Provisional application No. 60/597,351, filed on Nov. 28, 2005.

(51) Int. Cl.
*H01L 23/485* (2006.01)

(52) U.S. Cl.
USPC .......................................................... 257/758

(58) Field of Classification Search
USPC .......................................... 257/758; 977/932
See application file for complete search history.

(56) References Cited

U.S. PATENT DOCUMENTS

| | | | |
|---|---|---|---|
| 6,605,528 B1 * | 8/2003 | Lin et al. ........................ | 438/618 |
| 7,135,773 B2 | 11/2006 | Furukawa et al. | |
| 7,990,037 B2 | 8/2011 | Lin et al. | |
| 2001/0003629 A1 * | 6/2001 | Toguchi et al. ............... | 428/690 |
| 2002/0163079 A1 * | 11/2002 | Awano .......................... | 257/750 |
| 2003/0179559 A1 | 9/2003 | Engelhardt et al. | |
| 2003/0181328 A1 | 9/2003 | Hwang et al. | |
| 2003/0211724 A1 | 11/2003 | Haase | |
| 2004/0016948 A1 | 1/2004 | Lin | |

(Continued)

FOREIGN PATENT DOCUMENTS

| | | |
|---|---|---|
| JP | 2005072171 | 3/2005 |
| TW | 200427049 | 12/2004 |
| TW | I236722 | 7/2005 |
| TW | I237064 | 8/2005 |

OTHER PUBLICATIONS

Bohr, M. "The New Era of Scaling in an SoC World," International Solid-State Circuits Conference (2009) pp. 23-28.

(Continued)

*Primary Examiner* — Nimeshkumar Patel
*Assistant Examiner* — Christopher Raabe
(74) *Attorney, Agent, or Firm* — Seyfarth Shaw LLP

(57) ABSTRACT

The present invention proposes a circuit component structure, which comprises a semiconductor substrate, a fine-line metallization structure formed over the semiconductor substrate and having at least one metal pad, a passivation layer formed over the fine-line metallization structure with the metal pads exposed by the openings of the passivation layer, at least one carbon nanotube layer formed over the fine-line metallization structure and the passivation layer and connecting with the metal pads. The present invention is to provide a carbon nanotube circuit component structure and a method for fabricating the same, wherein the circuit of a semiconductor element is made of an electrically conductive carbon nanotube, and the circuit of the semiconductor element can thus be made finer and denser via the superior electric conductivity, flexibility and strength of the carbon nanotube.

17 Claims, 34 Drawing Sheets

(56) References Cited

U.S. PATENT DOCUMENTS

2005/0277283 A1   12/2005   Lin et al.
2006/0243958 A1   11/2006   Suh et al.
2010/0244262 A1    9/2010   Awano et al.

OTHER PUBLICATIONS

Bohr, M. "The New Era of Scaling in an SoC World," International Solid-State Circuits Conference (2009) Presentation Slides 1-66.
Edelstein D. C., "Advantages of Copper Interconnects," Proceedings of the 12th International IEEE VLSI Multilevel Interconnection Conference, 1995, 301-307.
Edelstein D., et al., "Full Copper Wiring in a Sub-0.25 pm CMOS ULS Technology," Technical Digest IEEE International Electron Devices Meeting, 1997, 773-776.
Gao X., et al., "An improved electrostatic discharge protection structure for reducing triggering voltage and parasitic capacitance," Solid-State Electronics, 2003, 1105-1110.
Geffken R. M., "An Overview of Polyimide Use in Integrated Circuits and Packaging," Proceedings of the Third International Symposium on Ultra Large Scale Integration Science and Technology, 1991, 667-677.
Groves R., et al., "High Q Inductors in a SiGe BiCMOS Process Utilizing Thick Metal Process Add-on Module," Proceedings of the Bipolar/BiCMOS Circuits and Technology Meeting, 1999, 149-152.
Hu C.K., et al., "Copper-Polyimide Wiring Technology for VLSI Circuits," Materials Research Society Symposium Proceedings VLSI V, 1990, 369-373.
Ingerly D., et al., "Low-K Interconnect Stack with Thick Metal 9 Redistribution Layer and Cu Die Bump for 45nm High Volume Manufacturing," International Interconnect Technology Conference, 2008, 216-218.
Jenei S., et al., "High Q Inductor Add-on Module in Thick Cu/SiLK™ single damascene," Proceedings from the IEEE International Interconnect Technology Conference, 2001, 107-109.
Kumar R., et al., "A Family of 45nm IA Processors," IEEE International Solid-State Circuits Conference, Session 3, Microprocessor Technologies, 2009, vol. 3 (2), 58-59.
Kurd N., et al., "Next Generation Intel® Micro-architecture (Nehalem) Clocking Architecture," Symposium on VLSI Circuits Digest of Technical Papers, 2008, 62-63.
Lee Y. H., et al., "Effect of ESD Layout on the Assembly Yield and Reliability," International Electron Devices Meeting, 2006, pp. 1-4.
Lin M. S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, 533-536.
Lin, M.S. et al., "A New System-on-a-Chip (SOC) Technology High Q Post Passivation Inductors," Proceedings from the 53rd Electronic Components and Technology Conference (May 30, 2003), 1503-1509.
Lin, M.S. Post Passivation Technology™—MEGIC® Way to System Solutions, Presentation given at TSMC Technology Symposium, Japan (Oct. 1, 2003) pp. 1-32.
Luther B., et al., "Planar Copper-Polyimide Back End of the Line Interconnections for ULSI Devices," Proceedings of the 10th International IEEE VLSI Multilevel Interconnection Conference, 1993, 15-21.
Maloney T., et al., "Novel Clamp Circuits for IC Power Supply Protection," IEEE Transactions on Components, Packaging, and Manufacturing Technology, Part C, 1996, vol. 19 (3), 150-161.
Maloney T. J., et al., "Stacked PMOS Clamps for High Voltage Power Supply Protection," Electrical Overstress Electrostatic Discharge Symposium Proceedings, 1999, 70-77.
Master R., et al., "Ceramic Mini-Ball Grid Array Package for High Speed Device," Proceedings from the 45th Electronic Components and Technology Conference, 1995, 46-50.
MEGIC Corp, "MEGIC way to system solutions through bumping and redistribution", Brochure, 2004, pp. 1-3.
Mistry K., et al., "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting, 2007, 247-250.
Roesch W., et al., "Cycling copper flip chip interconnects," Microelectronics Reliability, 2004, vol. 44, 1047-1054.
Sakran N., et al., "The Implementation of the 65nm Dual-Core 64b Merom Processor, Session 5, Microprocessors," IEEE International Solid-State Circuits Conference, 2007, vol. 5 (6), 106-107 and 590.
Theng C., et al., "An Automated Tool Deployment for ESD (Electro-Static-Discharge) Correct-by-Construction Strategy in 90 nm Process," IEEE International Conference on Semiconductor Electronics, 2004, 61-67.
Venkatesan S., et al., "A High Performance 1.8V, 0.20 pm CMOS Technology with Copper Metallization," Technical Digest IEEE International Electron Devices Meeting, 1997, 769-772.
Yeoh A., et al., "Copper Die Bumps (First Level Interconnect) and Low-K Dielectrics in 65nm High Volume Manufacturing," Electronic Components and Technology Conference, 2006, 1611-1615.
Yeoh T.S., "ESD Effects on Power Supply Clamps," Proceedings of the 6th International Symposium on Physical & Failure Analysis of Integrated Circuits, 1997, 121-124.

\* cited by examiner

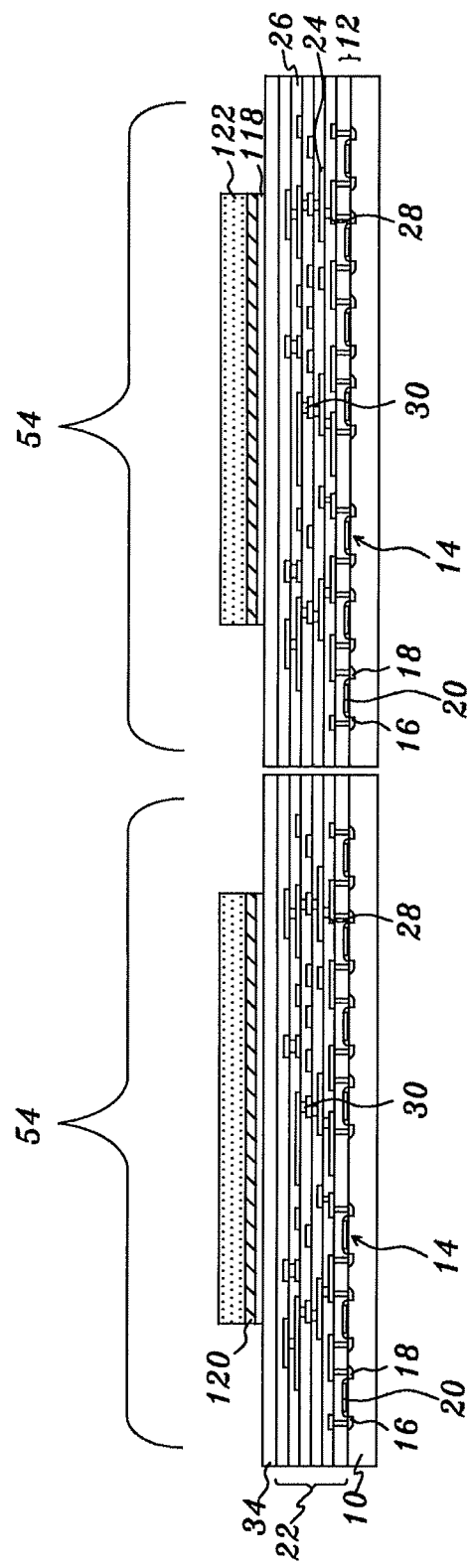

CARBON NANOTUBE CIRCUIT COMPONENT STRUCTURE

This application is a continuation of U.S. patent application Ser. No. 11/563,215, filed on Nov. 27, 2006, now U.S. Pat. No. 7,990,037, which claims the benefit of U.S. Provisional Application No. 60/597,351, filed on Nov. 28, 2005, all of which are herein incorporated by reference in their entirety.

BACKGROUND OF THE INVENTION

1. Field of the Invention

The present invention relates to a circuit component structure and a method for fabricating the same, particularly to a semiconductor circuit component structure and a method for fabricating the same, wherein a carbon nanotube circuit component structure replaces a metallic circuit component structure.

2. Description of the Related Art

A carbon nanotube is a nanometric tube structure composed of carbon atoms. Carbon nanotubes were discovered by Iijima in 1991 in arc-discharge products and published in Nature, Vol. 354, p. 56 (1991). The carbon nanotube has the characteristics of lightweight, high strength, high heat resistance, flexibility, high surface area, high surface curvature, high thermal conductivity and novel electric conductivity. According to the length, diameter and helicity, a carbon nanotube may present a metallic property or a semiconducting property. The metal-type carbon nanotube may function as a molecular metallic conducting line and plays a very important role in nano-electronics and material science.

The current semiconductor elements all adopt metals as the materials of circuits. According to the well-known Moore's Law of the semiconductor industry, the number of the transistors on a given chip is doubled every two years. Thus, the semiconductor technology has evolved from the sub-micron process into the nanometer process recently. With entering into the nanometer process, the number of transistors per unit area is obviously promoted. It means that transistors and chips can be made smaller. The nanometer process needs a nanometric photolithography and a nanometric fabrication technology. The nanometer process evolved from the original 90-nanometer process through the 60-nanometer process and has reached the 45-nanometer process, and the advance of the nanometer process has met a technical bottleneck now. The field concerned anticipates that the carbon nanotube technology will be a prominent solution to overcome the technical bottleneck of the nanometer process.

Accordingly, the present invention proposes a carbon nanotube circuit component structure and a method for fabricating the same, which are used to continuously electroplate circuit component structures and can be applied to fabricate passive semiconductor elements.

SUMMARY OF THE INVENTION

The primary objective of the present invention is to provide a carbon nanotube circuit component structure and a method for fabricating the same, wherein the circuit of a semiconductor element is made of an electrically conductive carbon nanotube, and the circuit of the semiconductor element can thus be made finer and denser via the superior electric conductivity, flexibility and strength of the carbon nanotube.

Another objective of the present invention is to provide a carbon nanotube circuit component structure and a method for fabricating the same, wherein carbon nanotubes are installed in a semiconductor element, and the heat dissipation capability of the semiconductor element is thus improved via the superior thermal conductivity of the carbon nanotubes.

To achieve the abovementioned objectives, the present invention proposes a circuit component structure, which comprises a semiconductor substrate, a fine-line metallization structure formed over the semiconductor substrate and having at least one metal pad, a passivation layer formed over the fine-line metallization structure with the metal pads exposed by the openings of the passivation layer, at least one carbon nanotube layer formed over the fine-line metallization structure and the passivation layer and connecting with the metal pads, and a first metal layer formed over the carbon nanotube layer.

To achieve the abovementioned objectives, the present invention proposes a circuit component structure, which comprises a semiconductor substrate, a fine-line metallization structure formed over the semiconductor substrate, a passivation layer formed over the fine-line metallization structure, and at least one first carbon nanotube layer formed over the passivation layer and including at least one first coil.

To achieve the abovementioned objectives, the present invention proposes a circuit component structure, which comprises a semiconductor substrate, a fine-line metallization structure formed over the semiconductor substrate and having at least two metal pads, a passivation layer formed over the fine-line metallization structure and having two openings to respectively expose the two metal pads, and a carbon nanotube layer formed over the passivation layer and connecting with the two openings and electrically connecting with the two metal pads.

To achieve the abovementioned objectives, the present invention proposes a circuit component structure, which comprises a semiconductor substrate, a passivation layer formed over the semiconductor substrate, and a carbon nanotube layer formed over the passivation layer.

To achieve the abovementioned objectives, the present invention proposes a circuit component structure, which comprises a semiconductor substrate having a first surface and a second surface with a plurality of semiconductor elements formed on the first surface, a fine-line metallization structure formed over the first surface of the semiconductor substrate and including at least one metal pad, a passivation layer formed over the fine-line metallization structure, and a carbon nanotube layer formed on the second surface.

To enable the objectives, technical contents, characteristics and accomplishments of the present invention to be easily understood, the embodiments of the present invention are to be described in detail in cooperation with the attached drawings below.

BRIEF DESCRIPTION OF THE DRAWINGS

FIG. 4a to FIG. 4g are diagrams schematically showing Aspect 1 of Embodiment IV of the present invention.

DETAILED DESCRIPTION OF THE INVENTION

The present invention pertains to a carbon nanotube circuit component structure and a method for fabricating the same, which disclose the structures of several types of semiconductor elements, wherein the circuit of each type of the semiconductor element is partially made of carbon nanotubes. The embodiments of the present invention are described below.

Embodiment I

Aspect 1 of Embodiment I

Figure 1A:
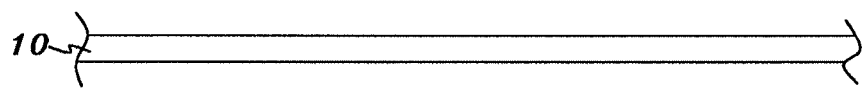
FIG. 1a to FIG. 1n are diagrams schematically showing Aspect 1 of Embodiment I of the present invention.

Refer to FIG. 1a. Firstly, a substrate 10 is provided, and the substrate 10 is commonly a silicon substrate, such as an intrinsic silicon substrate, a p-type silicon substrate or an n-type silicon substrate. To obtain a high performance chip, the substrate 10 may be a SiGe substrate or a SOI (Silicon-On-Insulator) substrate, wherein the SiGe substrate has a SiGe epitaxial layer formed over a silicon substrate; the SOI substrate has an insulating layer (silicon oxide is preferred) formed over a silicon substrate and a silicon or germanium epitaxial layer formed over the insulating layer.

Figure 1B:
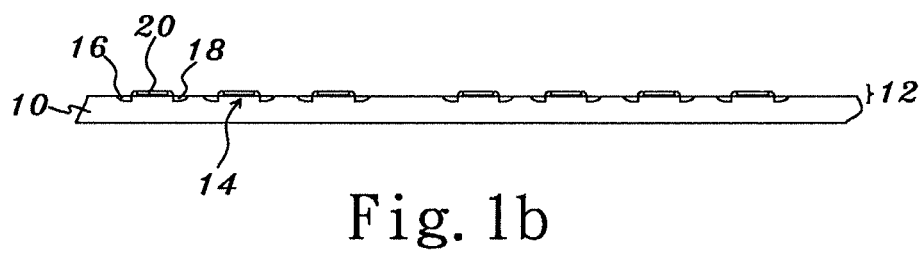
FIG. 1o to FIG. 1p are diagrams schematically showing Aspect 2 of Embodiment I of the present invention.
FIG. 1q to FIG. 1w are diagrams schematically showing Aspect 3 of Embodiment I of the present invention.

Refer to FIG. 1b. Next, a device layer 12 is formed over the substrate 10. The device layer 12 commonly has at least one semiconductor device. The device layer 12 is on and/or above the surface of the substrate 10. The semiconductor device may be a MOS (Metal Oxide Semiconductor) transistor 14, such as an NMOS transistor (n-channel MOS transistor) or a PMOS transistor (p-channel MOS transistor), wherein the MOS transistor 14 comprises a source 16, a drain 18 and a gate 20, and the gate 20 is may be made of polysilicon, tungsten polycide, tungsten silicide, titanium silicide, cobalt silicide or another silicide. The semiconductor device may also be a bipolar transistor, a DMOS (diffused MOS), an LDMOS (lateral diffused MOS), a CCD (Charge Coupled Device), a CMOS (Complementary MOS), a photosensitive diode, or a resistor element (derived from the polysilicon layer or the diffusion region of the silicon substrate). The abovementioned semiconductor devices may be used to form various circuits, such as a CMOS circuit, an NMOS circuit, a PMOS circuit, a BiCMOS circuit, a CMOS sensor circuit, a DMOS power source circuit, and an LDMOS circuit. The device layer 12 may further comprise a NOR gate, a NAND gate, an inverter, an AND gate, an OR gate, a SRAM cell, a DRAM cell, a non-volatile memory cell, a flash memory cell, an EPROM cell, a ROM cell, a magnetic RAM cell, a sense amplifier, an OPA (Op Amp, Operational Amplifier), an adder, a multiplexer, a diplexer, a multiplier, an analog/digital converter, a digital/analog converter, a CMOS sensor cell, a photosensitive diode, a CMOS transistor, a BiCMOS transistor, a bipolar circuit or an analog circuit.

A Taiwan patent I239071 has disclosed a "Method for Fabricating a Carbon Nanotube Transistor", wherein carbon nanotube transistors are formed on a silicon wafer. Thus, the specification of the present invention will not describe the related technology any more.

Figure 1C:
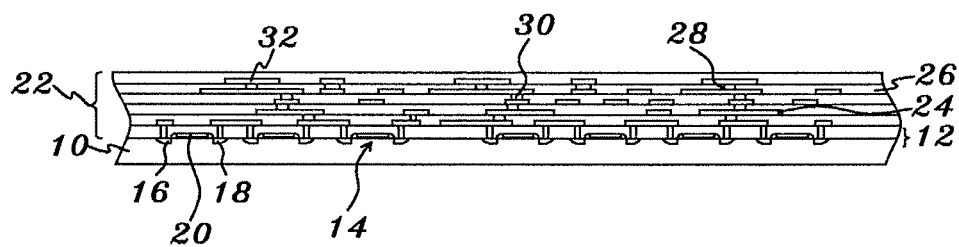

Refer to FIG. 1c. Next, a fine-line metallization structure 22 is formed over the substrate 10 and the device layer 12. The fine-line metallization structure 22 includes a plurality of fine-line conductivity layers 24, a plurality of fine-line dielectric layers 26, a plurality of openings 28 formed on the fine-line dielectric layers 26, and a plurality of conductive via plugs 30 formed inside the openings 28. Besides, one or a plurality of areas of the topmost fine-line conductivity layer 24 may be defined to be metal pads 32.

In this embodiment, the fine-line conductivity layer 24 is made of aluminum or copper. In detail, the fine-line conductivity layer 24 may be an aluminum layer formed with a sputtering method or a copper layer formed with a damascene method. The fine-line conductivity layers 24 may thus have the following cases: (1) the fine-line conductivity layers 24 are all aluminum layers, (2) the fine-line conductivity layers 24 are all copper layers, (3) the lower fine-line conductivity layers 24 are aluminum layers, and the upper fine-line conductivity layers 24 are copper layers, and (4) the lower fine-line conductivity layers 24 are copper layers, and the upper fine-line conductivity layers 24 are aluminum layers.

Each fine-line conductivity layer 24 has a thickness of between 0.05 and 2 µm with a preferred thickness of between 0.2 and 1 µm. When the fine-line conductivity layer 24 functions as a circuit, the transverse dimension (width) of the circuit is between 20 nm (nanometer) and 15 µm with a preferred thickness of between 20 nm to 2 µm.

The methods for fabricating the abovementioned structures are to be described below.

Firstly, the method for fabricating the aluminum fine-line conductivity layer 24 is introduced below. The aluminum layer of the fine-line conductivity layers 24 is commonly fabricated with a PVD (Physical Vapor Deposition) method, such as a sputtering method. Next, the aluminum layer is patterned with a photoresist layer having a thickness of between 0.1 and 4 µm with a preferred thickness of between 0.3 and 2 µm. Next, the aluminum layer is processed with a wet etching or a dry etching, and a dry plasma etching is preferred, wherein the plasma usually contains fluorine plasma. Optionally, an adhesion/barrier layer may be formed below the aluminum layer, wherein the material of the adhesion/barrier layer may be titanium, a titanium tungsten alloy, titanium nitride, or a composite layer made of the abovementioned materials. An anti-reflection layer, such as a titanium nitride layer, may also be optionally formed over the aluminum layer. A CVD (Chemical Vapor Deposition) method may be optionally used to fill the openings 28 with tungsten; then, a CMP (Chemical Mechanical Polish) method is used to polish the tungsten layer to form the electrically conductive via plugs 30.

Next, the method for fabricating the copper fine-line conductivity layer 24 is introduced below. The copper layer of the fine-line conductivity layers 24 is commonly fabricated with an electroplating method and a damascene method. The method for fabricating the copper fine-line conductivity layer 24 includes the following steps: (1) depositing a copper diffusion barrier layer, such as a nitride layer or an oxynitride layer having a thickness of between 0.05 and 0.25 µm; (2) depositing a fine-line dielectric layer 26 having a thickness of between 0.1 and 2.5 µm with a preferred thickness of between 0.3 and 1.5 µm via a PECVD (Plasma Enhanced CVD) method, a spin-on coating method, or a HDPCVD (High Density Plasma CVD) method; (3) patterning the fine-line dielectric layer 26 with a photoresist layer having a thickness of between 0.1 and 4 µm with a preferred thickness of between 0.3 and 2 µm, and exposing and developing the photoresist layer to form a plurality of openings and/or a plurality of trenches and then removing the photoresist layer; (4) depositing an adhesion/barrier layer and a seed layer with a sputtering method or a CVD method, wherein the material of the adhesion/barrier layer may be tantalum, tantalum nitride, titanium nitride, titanium, a titanium tungsten alloy, or the composite layer made of the abovementioned materials, wherein the seed layer is commonly a copper layer, and the copper layer is fabricated with a sputtering method, a CVD method, or a CVD plus sputtering method; (5) electroplating a copper layer on the seed layer, wherein the copper layer has a thickness of between 0.05 and 2 µm with a preferred thickness of between 0.2 and 1 µm; (6) removing the copper layer, the seed layer and the adhesion/barrier layer except those inside the openings or the trenches of the fine-line dielectric layer 26 with a polishing method (preferably with a CMP method) used in polishing a wafer until the fine-line dielectric layer 26 below the adhesion/barrier layer is exposed. After the CMP process, only the metal inside the openings or the trenches remains, and the remaining metal is used as metallic conductors (in the form of lines or planes) or used as the conductive via plugs 30 to connect the neighboring fine-line conductivity layers 24. Besides, in a double-damascene technology, the conductive via plugs 30 and metallic lines/planes can be simultaneously fabricated with an electroplating process and a CMP process. The double-damascene technology may adopt a double-photolithography process and a double-electroplating process. Between the abovementioned Step (3) for patterning a dielectric layer and Step (4) for depositing a metallic layer, the double-damascene technology has additional steps to deposit and pattern another dielectric layer.

Next, the method for fabricating the fine-line dielectric layer 26 is introduced below. The fine-line dielectric layer 26 may be fabricated with a PECVD (Plasma Enhanced CVD) method, an HDPCVD (High Density Plasma CVD) or a spin-on coating method. The material of the fine-line dielectric layer 26 may be silicon oxide, silicon nitride, silicon oxynitride, PECVD TEOS (tetraethyl orthosilicate fabricated via PEVCD), SOG (Spin-On Glass, silicon oxide or siloxane), FSG (Fluorinated Silicate Glass) or a low-permittivity (low-K) material. The low-K material may be Black Diamond (a product of Applied Materials Co.), ULK CORAL (a product of Novellus Co.) or SiLK (a product of IBM Co.). The PECVD silicon oxide (silicon oxide fabricated with a PECVD method), the PECVD TEOS, or the HDPCVD oxide has a permittivity K of between 3.5 and 4.5. The PECVD FSG or the HDPCVD FSG has a permittivity K of between 3.0 and 3.5. The low-permittivity (low-K) material has a permittivity K of between 1.5 and 3.5. The low-permittivity (low-K) material, such as a Black Diamond film, is porous and composed of hydrogen, carbon, silicon and oxygen with the molecular formula thereof $H_wC_xSi_yO_z$. Each fine-line dielectric layer 26 has a thickness of between 0.05 and 2 µm. The fine-line dielectric layer 26 usually contains inorganic materials to achieve a thickness of over 2 µm. The openings 28 in the fine-line dielectric layer 26 are fabricated via performing a wet etching or a dry etching on a patterned photoresist layer, and a dry etching is preferred. The abovementioned dry etching includes a fluorine plasma etching.

Refer to FIG. 1c. A passivation layer 34 is formed over the fine-line metallization structure 22, and the passivation layer 34 plays a very important role in the present invention. The passivation layer 34 is a very important component in IC industry. For example, "Silicon Processing in the VLSI Era", Vol. 2, by S. Wolf, published by Lattice Press, 1990, states that the passivation layer 34 is defined to be the final layer and formed on the surface of the entire wafer in the IC fabrication process. The passivation layer 34 functions as an insulating layer and a protection layer and can protect IC from mechanical damage and chemical damage during packaging and assembling. In addition to preventing from mechanical scratches, the passivation layer 34 can also prevent mobile ions, such as sodium ions, transition-metal ions (copper and gold), from penetrating into the IC elements below the passivation layer 34. Further, the passivation layer 34 may also prevent moisture from entering into the underneath elements and connection lines (the fine-line metallization structures and the fine-line dielectric layer).

The passivation layer 34 usually comprises a silicon nitride layer and/or a silicon oxynitride layer and has a thickness of between 0.2 and 1.5 µm with a preferred thickness of between 0.3 and 1.0 µm. The passivation layer 34 may also be made of a PECVD silicon oxide, PETEOS (plasma-enhanced tetraethyl orthosilicate), PSG (phosphosilicate glass), BPSG (borophospho silicate glass), or an HDP oxide (oxide fabricated via a high density plasma method). Below, the exemplifications of the composite layer of the passivation layer 34 are described with the structures thereof mentioned in the bottom-up sequence: (1) oxide having a thickness of between 0.1 and 1.0 µm with a preferred thickness of between 0.3 and 0.7 µm/silicon nitride having a thickness of between 0.25 and 1.2 µm with a preferred thickness of between 0.35 and 1.0 µm, wherein such a type of passivation layer 34 is commonly overlaid on the metallic conducting lines made of aluminum, and the aluminum conducting lines are usually fabricated with an aluminum-sputtering process and an aluminum-etching process; (2) oxynitride having a thickness of between 0.05 and 0.35 µm with a preferred thickness of between 0.1 and 0.2 µm/oxide having a thickness of between 0.2 and 1.2 µm with a preferred thickness of between 0.1 and 0.2 µm/nitride having a thickness of between 0.2 and 1.2 µm with a preferred thickness of between 0.3 and 0.5 µm/oxide having a thickness of between 0.2 and 1.2 µm with a preferred thickness of between 0.3 and 0.6 µm, wherein such a type of passivation layer 34 is commonly overlaid on the metallic conducting lines made of copper, and the copper conducting lines are usually fabricated with an electroplating process, a CMP process and a damascene process. The oxide layers of the abovementioned two exemplifications may be made of a PECVD silicon oxide, a PETEOS oxide, or an HDPCVD oxide. The contents stated above apply to all the embodiments of the present invention.

Figure 1D:
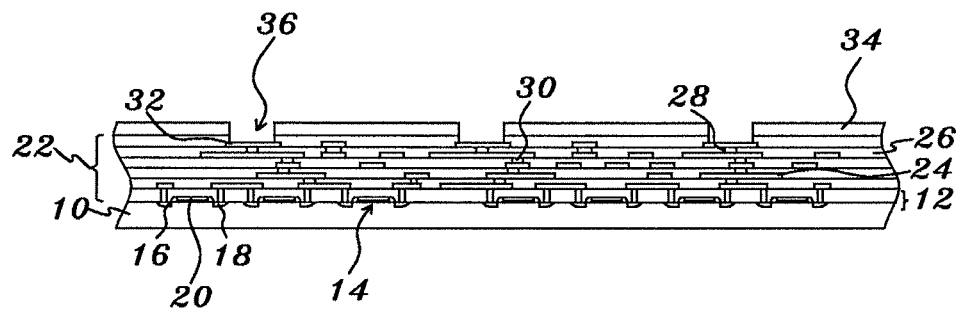

Refer to FIG. 1d. A wet etching process or a dry etching process may be used to fabricate at least one opening 36 on the passivation layer 34, and a dry etching process is preferred. The opening 36 has a dimension of between 0.1 and 200 µm with a preferred dimension of between 1 and 100 µm or between 5 and 30 µm. The shape of the opening 36 may be a circle, a square, a rectangle or a polygon, and the abovementioned dimension is thus the diameter of a circle, the length of one side of a square, the width of a rectangle or the length of the greatest diagonal of a polygon. When the shape of the opening 36 is a rectangle, the dimension of the rectangle is limited to between 1 µm and 1 mm with a preferred dimension of between 5 and 200 µm.

The passivation layer 34 has different-size openings 36 corresponding to different devices of the device layer 12. The dimension of the opening 36 of the passivation layer 34 is commonly between 0.1 and 100 µm with a preferred dimension of between 0.3 and 30 µm. When there are voltage stabilizers, transformers or discharge protection circuits installed on the device layer 12, the corresponding openings 36 should have a greater dimension of between 1 and 150 µm with a preferred dimension of between 5 and 100 µm. The openings 36 expose the metal pads 32 at the topmost layer of the fine-line conductivity layer 24, and the metal pads 32 can thus electrically connect with the lines or the planes over the passivation layer 36.

The abovementioned structures, especially the gate length or the effective channel length of the MOS transistor 14, are used to define the generation of an IC fabrication process, such as the 1-micron process, 0.8-micron process, 0.6-micron process, 0.5-micron process, 0.35-micron process, 0.25-micron process, 0.18-micron process, 0.13-micron process, 90 nm process, 65 nm process, 45 nm process, 35 nm process, and 25 nm process.

The substrates 10 are fabricated on a wafer, and a wafer commonly has a diameter of 5 inches, 6 inches, 8 inches, 12 inches, or 18 inches. The substrate 10 is fabricated with a photolithographic process, which comprises a photoresist coating step, a photoresist exposing step and a photoresist developing step. The photoresist used to fabricate the substrate 10 has a thickness of between 0.1 and 0.4 μm and is exposed with a 5× stepper or 5× scanner. The magnification of a stepper is the ratio of the pattern on a photomask to the pattern projected on a wafer. For example, 5× means that the pattern on a photomask is five times greater than that projected on a wafer. The scanner used in the advanced process commonly adopts a 4× magnification to improve resolution. The light beam used in a stepper or a scanner may have a wavelength of 436 nm (g-line), 365 nm (i-line), 248 nm (DUV, deep ultraviolet), 157 nm (DUV), or 13.5 nm (EUV, extreme ultraviolet). Besides, a high-index immersion photolithography may also be used to fabricate the fine-line conductivity layer 24.

Wafers must be fabricated in a clean room of class 10 or above class 10. For a class 10 clean room, one cubic feet of air is allowed to have none or one particle equal to or greater than 1 μm, 10 or less particles equal to or greater than 0.5 μm, 30 or less particles equal to or greater than 0.3 μm, 75 or less particles equal to or greater than 0.2 μm, and 350 or less particles equal to or greater than 0.1 μm. For a class 1 clean room, one cubic feet of air is allowed to have none or one particle equal to or greater than 0.5 μm, 3 or less particles equal to or greater than 0.3 μm, 7 or less particles equal to or greater than 0.2 μm, and 35 or less particles equal to or greater than 0.1 μm.

When the fine-line conductivity layer 24 is made of copper, metal caps (not shown in the drawings) are used to protect the cupric metal pads 32 exposed by the openings 36 of the passivation layer 34. The metal caps not only can protect the metal pads 32 from oxidation but also can be used as the joint pads in the later wire-bonding process. The metal cap is an aluminum layer, a gold layer, a titanium layer, a titanium tungsten alloy layer, a tantalum layer, a tantalum nitride layer or a nickel layer. When the metal cap is an aluminum layer, a barrier layer must be interposed between the aluminum layer and the cupric metal pad. The barrier layer is made of titanium, a titanium tungsten alloy, titanium nitride, tantalum, tantalum nitride, chromium, or nickel.

Figure 1E:
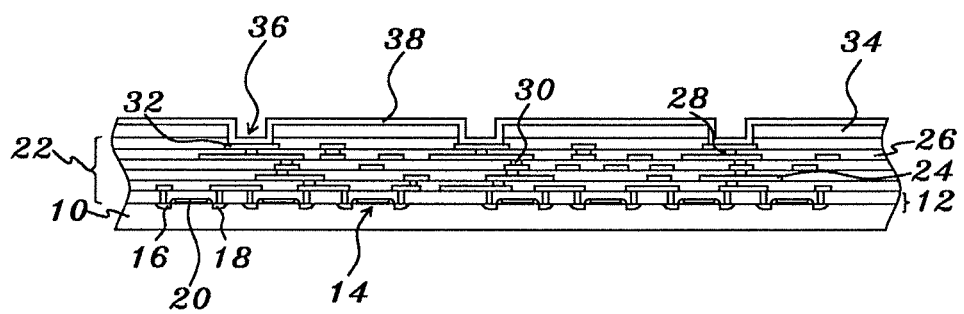

Next, the method for fabricating the over-passivation scheme is introduced below. In this embodiment, the over-passivation scheme includes the conductivity layer made of carbon nanotubes. Refer to FIG. 1e. Firstly, an adhesion/barrier layer 38 is formed over the passivation layer 34 and the metal pads 32. The adhesion/barrier layer 38 is made of titanium, tungsten, cobalt, nickel, titanium nitride, a titanium tungsten alloy, vanadium, chromium, copper, a copper chromium alloy, tantalum, and tantalum nitride. The adhesion/barrier layer 38 may also be made of an alloy containing the abovementioned metals or a composite layer containing the abovementioned materials. The adhesion/barrier layer 38 is fabricated with an electroplating method, an electroless plating method, a CVD method, or a PVD method, and a PVD method, such as a metal-sputtering process, is preferred among them. The adhesion/barrier layer 38 has a thickness of between 0.02 and 0.8 μm with a preferred thickness of between 0.05 and 0.2 μm.

Figure 1F:
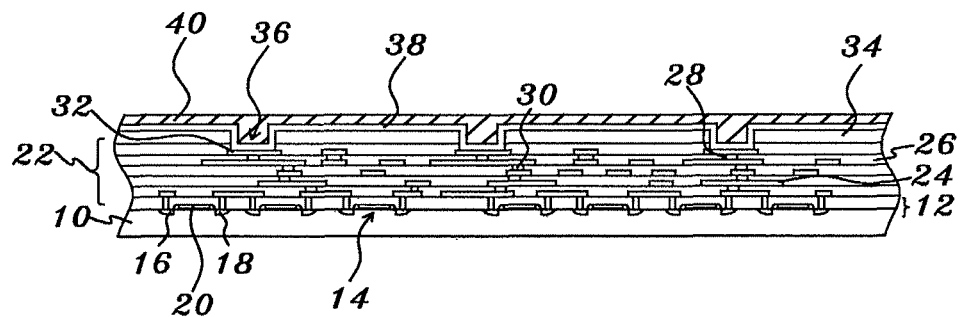

Refer to FIG. 1f. Next, a catalytic metal layer 40 is formed over the adhesion/barrier layer 38 and has a thickness of between 1 and 10 μm. The catalytic metal layer 40 is very important to form a carbon nanotube layer, and the methods for fabricating the catalytic metal layer 40 are introduced below.

Method 1 for Fabricating the Catalytic Metal Layer 40

This method fabricates the catalytic metal layer 40 via a solution approach. Firstly, a catalytic metal is attached to particles of a precious metal. The catalytic metal is iron, cobalt or nickel. The precious metal may be gold, silver, platinum, palladium, copper, or an alloy of the abovementioned metals, and silver is preferred among them. The precious metal particle has a diameter of between 0.01 and 10 μm. There are two methods to attach a catalytic metal to a precious metal: one is the soak method, and the other is the precipitation method.

In the soak method, ultrasonic vibration is used to disperse precious metal particles into a solution, and the solution is mixed with a solution containing the salt of a catalytic metal. The solution of the catalytic metal salt may be a nitrate solution or a sulfate solution. The mixed solution is concentrated via heating, and the solvent is removed from the mixed solution, and the catalytic metal is thus attached to the particles of the precious metal.

In the precipitation method, a basic solution is added to a solution containing precious metal particles. The basic solution, such as ammonia solution, can make the mixed solution have a pH value of between 8 and 9. The mixed solution is heated, and the surface of the precious metal particles is modified to be basic. A solution containing the salt of a catalytic metal is added to the mixed solution, and the mixed solution is agitated to obtain a uniform solution. The solution of the catalytic metal salt may be a nitrate solution or a sulfate solution. A precipitating agent and a reducing agent are added to the mixed solution; the precipitating agent may adopt ammonia solution, and the reducing agent may adopt formaldehyde. The ion of the catalytic metal is reduced to be the catalytic metal, and the catalytic metal is precipitated on the particles of the precious metal.

The catalytic metal-attached particles of a precious metal are distributed on and attached to the surface of the adhesion/barrier layer 38. There are several methods to distribute the catalytic metal-attached particles of a precious metal on the surface of the adhesion/barrier layer 38. In a first method, the particles are mixed with a polymeric gel, and the ratio of the particles to the polymeric gel is between 1:10 and 1:3. The polymeric gel contains 35 wt % of cellulose resin, 50 wt % of dl-a-terpineol, 10 wt % of sodium phosphate (functioning as a dispersant), and 15 wt % of glass powder (increasing bonding capability). The particle-containing polymeric gel is coated on the surface of the adhesion/barrier layer 38 and then baked at a temperature of between 300 and 500° C. to remove the polymeric gel. Thereby, the catalytic metal-attached particles of a precious metal are distributed on and attached to the surface of the adhesion/barrier layer 38.

In a second method, the catalytic metal-attached particles of a precious metal are mixed with an organic solvent and uniformly dispersed into the organic solvent via ultrasonic vibration. The mixed solution is applied onto the surface of the adhesion/barrier layer 38 and then baked to remove the organic solvent. Thereby, the catalytic metal-attached particles of a precious metal are distributed on and attached to the surface of the adhesion/barrier layer 38.

Method 2 for Fabricating the Catalytic Metal Layer 40

This method fabricates the catalytic metal layer 40 via a sputtering approach. This method needs a target, such as a nickel alloy target, a nickel silver alloy target, a nickel platinum alloy target, or a nickel copper alloy target, and a nickel silver target is preferred among them. In a reaction chamber, nickel and silver are formed over a substrate.

Figure 1G:
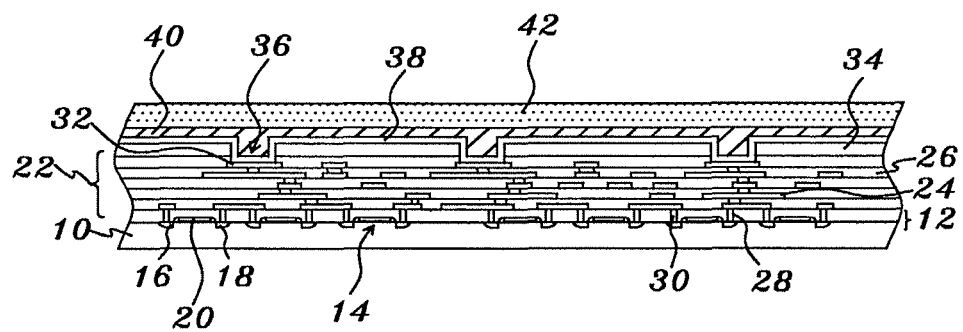

Refer to FIG. 1g. The substrate 10 is placed inside a reactor to perform a thermochemical vapor deposition reaction to form a carbon nanotube layer 42 having a thickness of between 100 nm and 20 μm over the catalytic metal layer 40. The reaction gases include an inert gas (such as helium, argon or nitrogen), hydrogen and a carbon-source gas (such as a hydrocarbon or carbon monoxide). The reaction temperature is between 400 and 600° C., and the reaction pressure is between 0.5 and 3 atm. The generated carbon nanotube has a diameter of between 1 and 200 nm. Further, a magnetic device may be installed on the bottom surface of the substrate 10 or below the substrate 10 to attract the electric-conduction type carbon nanotubes to deposit on the catalytic metal layer 40.

Figure 1H:
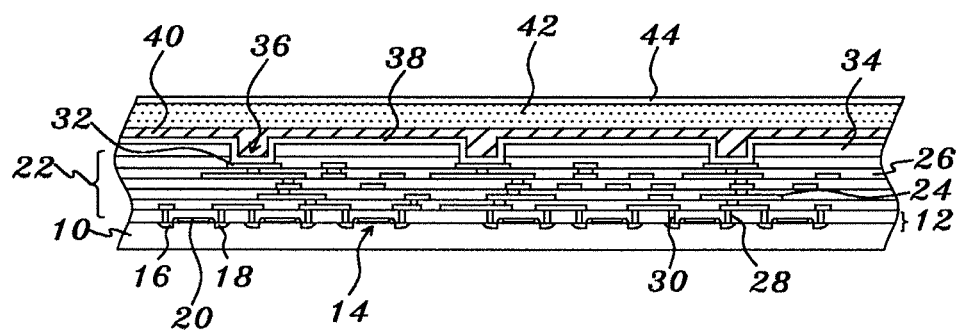

Refer to FIG. 1h. An adhesion/barrier layer 44 is formed over the carbon nanotube layer 42. The method for fabricating the adhesion/barrier layer 44 is the same as that for fabricating the adhesion/barrier layer 38 and is not to be described repeatedly here.

Figure 1I:
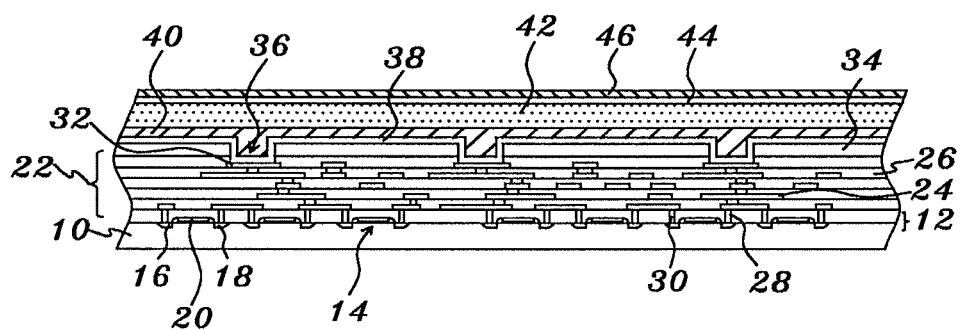

Refer to FIG. 1i. A seed layer 46 is formed over the adhesion/barrier layer 44 to benefit the succeeding building of metallic lines. The material of the seed layer 46 varies with that of the succeeding metallic lines.

When copper metallic lines are to be electroplated on the seed layer 46, copper is a preferable material to the seed layer 46. When silver metallic lines are to be electroplated on the seed layer 46 silver is a preferable material to the seed layer 46. When palladium metallic lines are to be electroplated on the seed layer 46, palladium is a preferable material to the seed layer 46. When platinum metallic lines are to be electroplated on the seed layer 46, platinum is a preferable material to the seed layer 46. When rhodium metallic lines are to be electroplated on the seed layer 46, rhodium is a preferable material to the seed layer 46. When ruthenium metallic lines are to be electroplated on the seed layer 46, ruthenium is a preferable material to the seed layer 46. When rhenium metallic lines are to be electroplated on the seed layer 46, rhenium is a preferable material to the seed layer 46. When nickel metallic lines are to be electroplated on the seed layer 46, nickel is a preferable material to the seed layer 46.

Figure 1J:
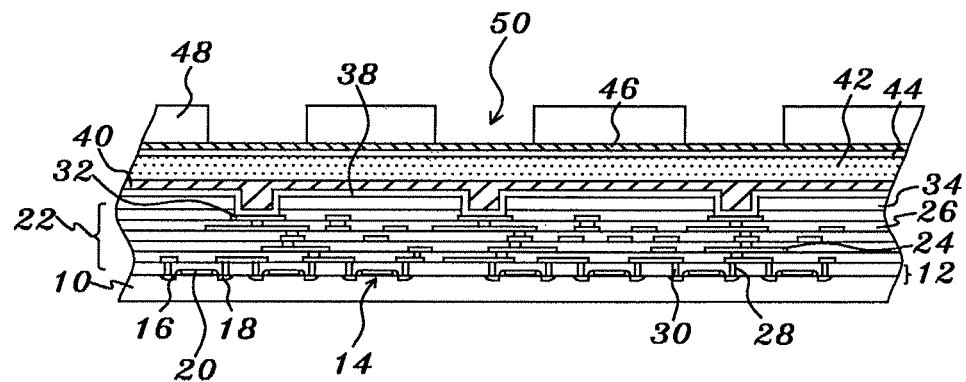

Refer to FIG. 1j. A patterned photoresist layer 48 is formed over the seed layer 46, and the patterned photoresist layer 48 has at least one opening 50 exposing a portion of the seed layer 46. The patterned photoresist layer 48 is a liquid photoresist or a dry film photoresist. The liquid photoresist is formed with a single spin-coating method, a multiple-spin-coating method or a printing method. The liquid photoresist has a thickness of between 3 and 60 μm with a preferred thickness of between 5 and 40 μm. The dry film photoresist is formed with a laminating method. The dry film photoresist has a thickness of between 30 and 300 μm with a preferred thickness of between 50 and 150 μm. The photoresist may be positive type or negative type, and the positive type thick photoresist is preferable to achieve a better resolution. The photoresist is exposed with an aligner or a 1× stepper. 1× means the ratio of the pattern on a photomask (commonly made of quartz or glass) to the pattern projected on a wafer is equal to 1:1. The light used by the aligner or 1× stepper has a wavelength of 436 nm (g-line), 397 nm (h-line), or 365 nm (i-line). The light used by the aligner or 1× stepper may also be a g/h line (g-line plus h-line), or a g/h/i line (the combination of g-line, h-line and i-line). The 1× stepper (or the 1× aligner) using the g/h line or the g/h/i line can provide a greater light intensity for exposing a thick photoresist or a photosensitive polymer. The opening 50 of the patterned photoresist layer 48 may have a shape of a loop, a circle or a rectangle.

Figure 1K:
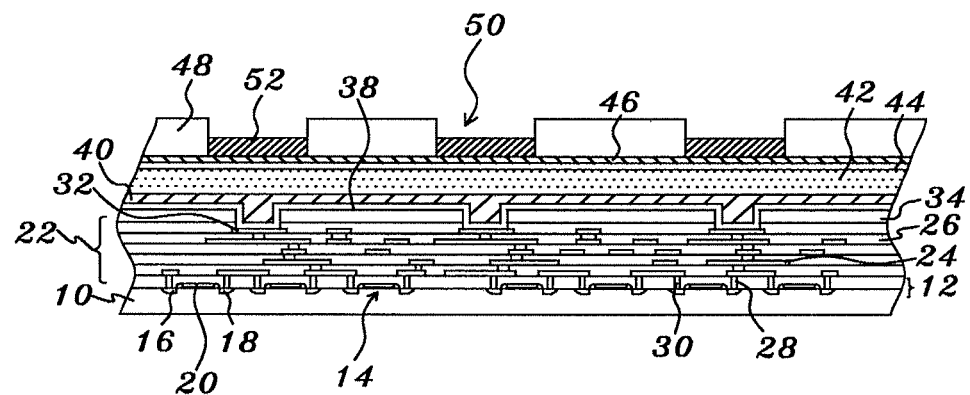

Refer to FIG. 1k. A metal layer 52 is formed inside the openings 50 and on the seed layer 46 over the passivation layer 34 with an electroplating method. The metal layer 52 may be a single-layer metallic structure made of gold, copper, silver, palladium, platinum, rhodium, ruthenium, rhenium, or nickel. The metal layer 52 may also be a composite layer made of the abovementioned metals. The metal layer 52 has a thickness of between 1 and 50 μm with a preferred thickness of between 2 and 30 μm. In this embodiment, the metal layer 52 is made of gold. When the opening 50 of the patterned photoresist layer 48 has a shape of a loop, the carbon nanotube layer 42 and the metal layer 52 are used as inductor elements.

Figure 1L:
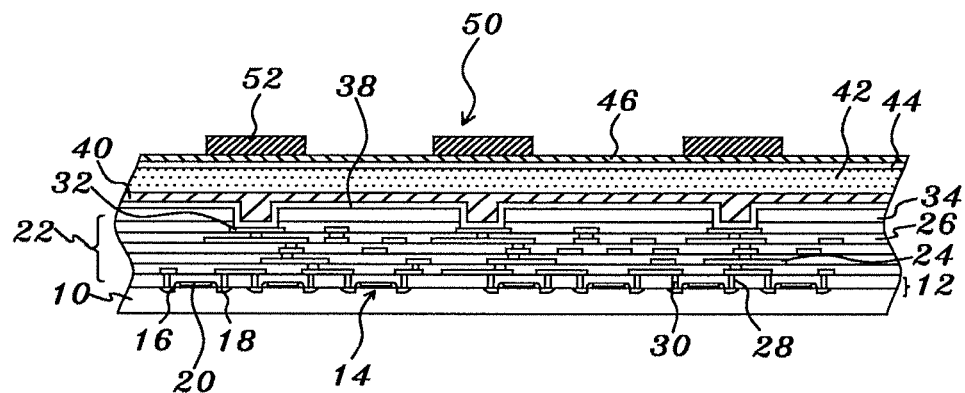

Refer to FIG. 1L. The patterned photoresist layer 48 is removed with an organic solvent or an inorganic solvent. The organic solvent may be acetone or an alcohol. The inorganic solvent may be sulfuric acid or hydrogen peroxide. The patterned photoresist layer 48 may also be incinerated with high pressure oxygen.

Figure 1M:
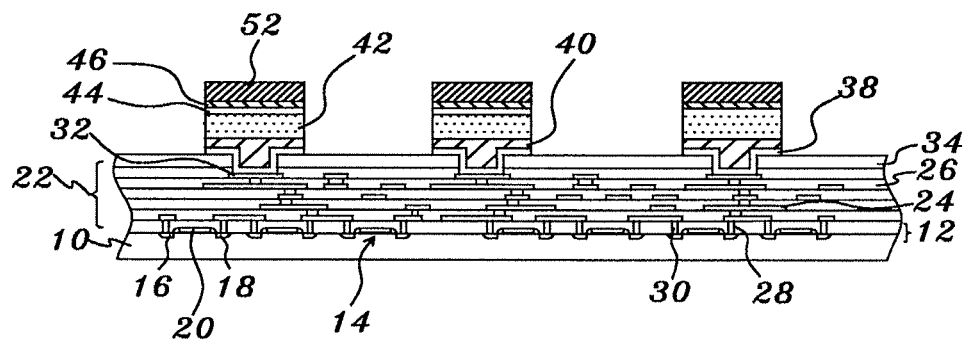

Refer to FIG. 1m. The seed layer 46, the adhesion/barrier layer 44, the carbon nanotube layer 42, the catalytic metal layer 40, and the adhesion/barrier layer 38 are removed except those below the metal layer 52. If the seed layer 46 is made of gold, it can be removed with a iodine-containing etchant. The adhesion/barrier layer 44 and the adhesion/barrier layer 38 may be removed with a dry etching method or a wet etching method. The dry etching method may be implemented with a high-pressure argon sputter-etching method. When the adhesion/barrier layers 44 and 38 are made of a titanium-tungsten alloy, they can be removed with hydrogen peroxide. The carbon nanotube layer 42 may be incinerated with high-pressure oxygen. The catalytic metal layer 40 may be removed with a high-pressure argon sputter-etching method. The catalytic metal layer 40 may also be etched away with a solution of hydrogen peroxide and ammonia or a solution of hydrogen peroxide and hydrogen chloride.

Figure 1N:
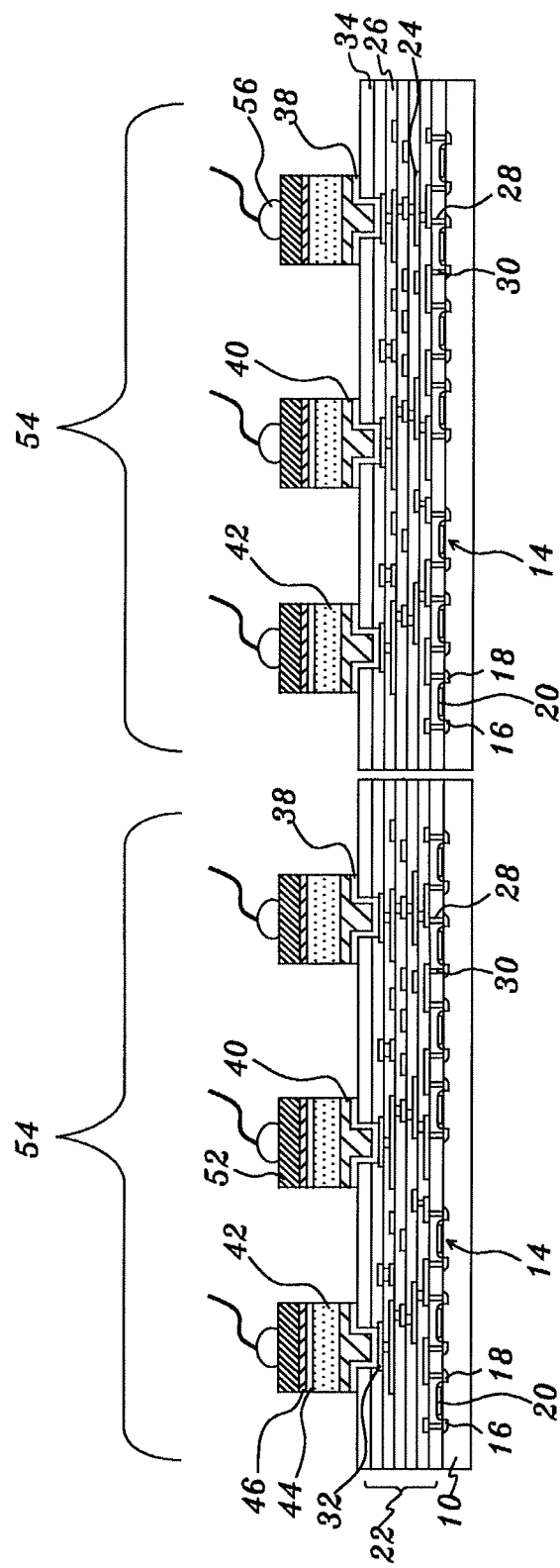
Figure 10:
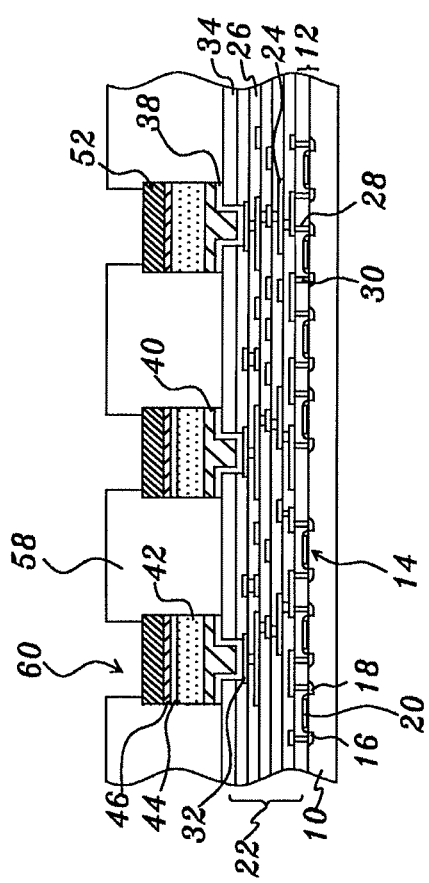

Refer to FIG. 1n. The substrate 10 is diced into a plurality of semiconductor chips 54. A wire 56, via which the chip 54 is connected to an external circuit, is formed on the surface of the metal layer 52 with a wire-bonding process. Thus, the description of Aspect 1 of Embodiment I is completed here.

Aspect 2 of Embodiment I

Figure 1P:
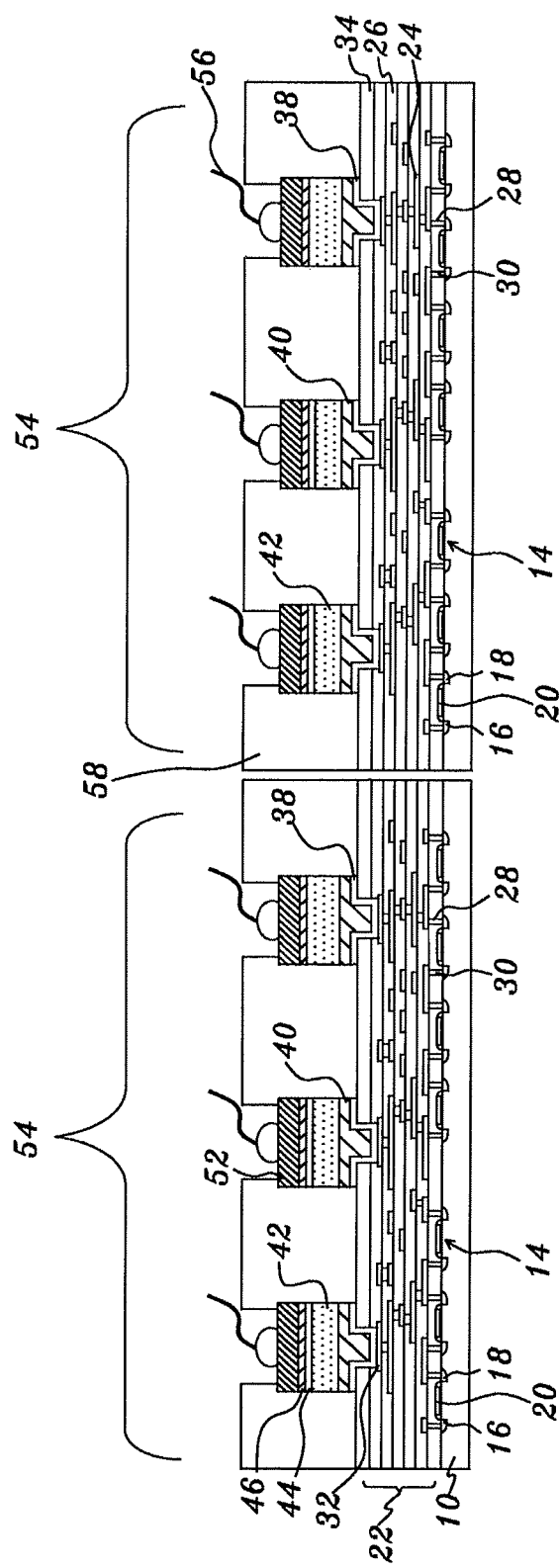

Refer to FIG. 1o. The structure of Aspect 2 is essentially similar to that of Aspect 1. However, in Aspect 2, a polymer layer 58 having a thickness of between 2 and 50 μm is formed over the passivation layer 34 and the metal layer 52. At least one opening 60 is formed in the polymer layer 58 to expose the surface of the metal layer 52. The polymer layer 58 is made of PI (polyimide), BCB (benzocyclobutene), or parylene. The polymer layer 58 may also be made of an epoxy-based material, such as the photoepoxy SU-8 (provided by Sotec Microsystems Co., Renens, Switzerland), or an elastomer, such as silicone. When the polymer layer 58 is made of a photosensitive material, the polymer layer 58 can be patterned without any etching step but singly with a photolithography process. Refer to FIG. 1p. The polymer layer 58 is cured. Next, the substrate 10 is diced into a plurality of semiconductor chips 54. Then, with a wire-bonding process, a wire 56, via which the chip 54 is connected to an external circuit, is formed on the surface of the metal layer 52 inside the opening 60 of the polymer layer 58. Thus, the description of Aspect 2 of Embodiment I is completed here.

Aspect 3 of Embodiment I

Figure 1Q:
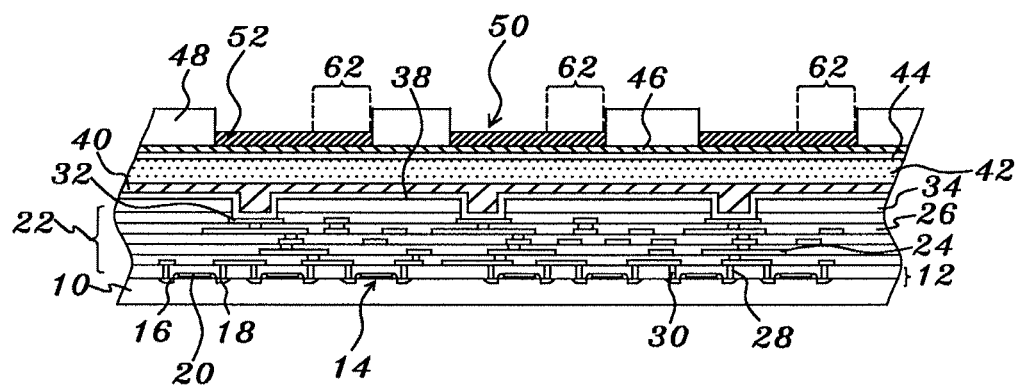
Figure 1R:
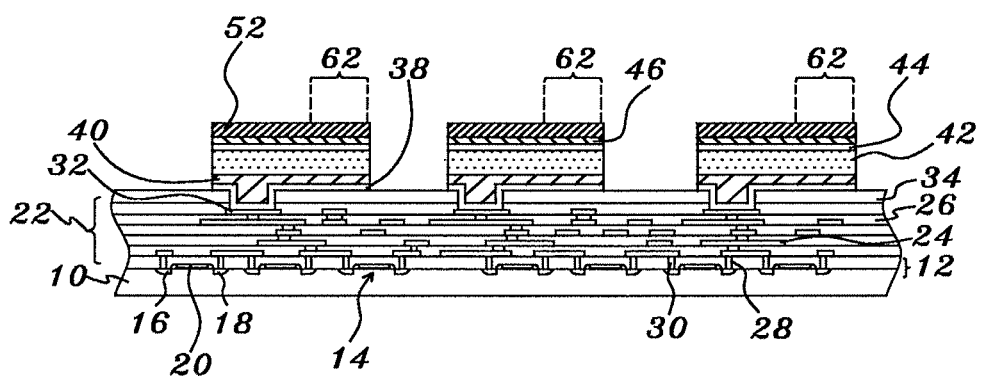
Figure 1S:
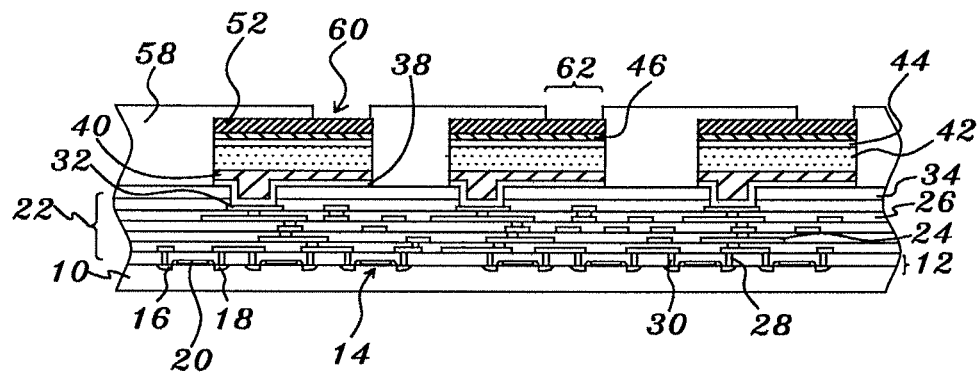
Figure 1T:
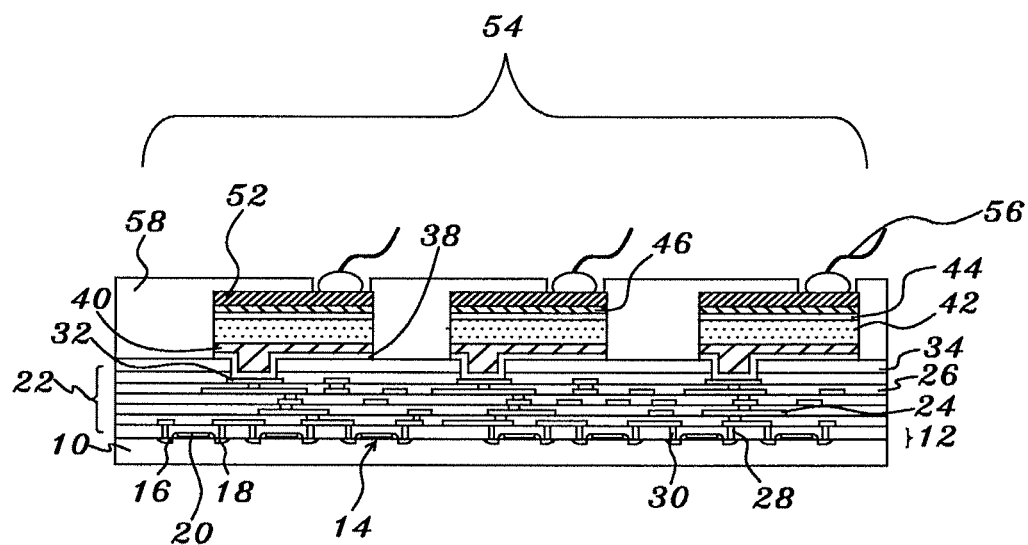

Refer to FIG. 1*q*. The structure of Aspect 3 is essentially similar to the structures of Aspect 1 and Aspect 2. In Aspect 1 and Aspect 2 of Embodiment I, the wires 56 are formed exactly above the metal pads 32 of the fine-line metallization structure 22. In Aspect 3 of Embodiment I, the metal layer 52 is extended to above one side of the opening 36 of the passivation layer 34 during its fabrication, and a portion of the metal layer 52 is defined to be a metal pad 62. From a top view, the metal pad 62 does not coincide with the metal pad 32 located inside the opening 36 of the passivation layer 34, and the structure of Aspect 3 is thus referred to as a redistribution layer (RDL) in the industry. Refer to FIG. 1*r*. Similarly, the patterned photoresist layer 48 is removed, and the seed layer 46, the adhesion/barrier layer 44, the carbon nanotube layer 42, the catalytic metal layer 40, and the adhesion/barrier layer 38 are removed except those below the metal layer 52. Refer to FIG. 1*s*. Similarly, a polymer layer 58 is formed over the passivation layer 34 and the metal layer 52, and at least one opening 60 is formed in the polymer layer 58 to expose a portion of the metal layer 52's surface. Refer to FIG. 1*t*. Similarly, the polymer layer 58 is cured, and the substrate 10 is diced into a plurality of semiconductor chips 54. Similarly, with a wire-bonding process, a wire 56, via which the chip 54 is connected to an external circuit, is formed on the surface of the metal layer 52 inside the opening 60 of the polymer layer 58. Thus, the description of Aspect 3 of Embodiment I is completed here.

Aspect 4 of Embodiment I

Figure 1U:
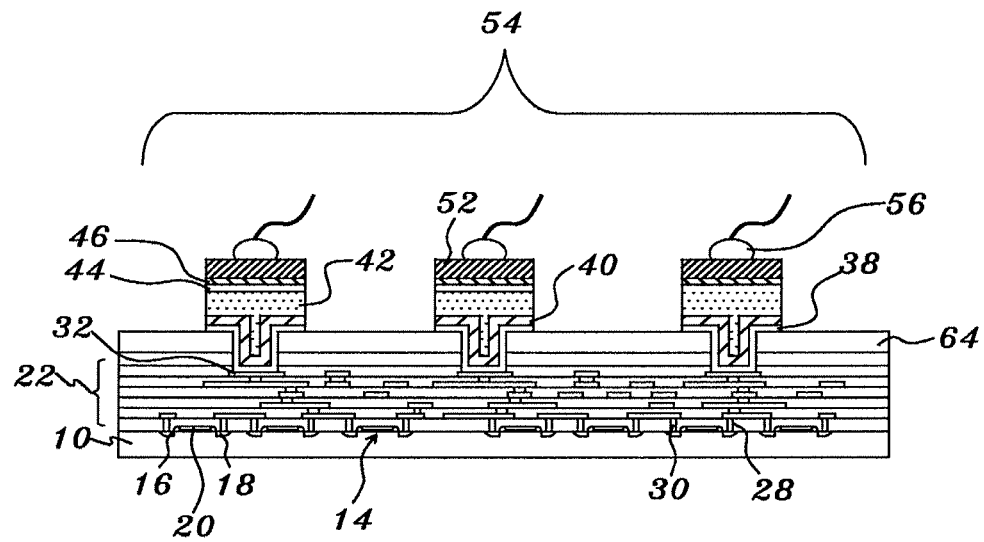
Figure 1V:
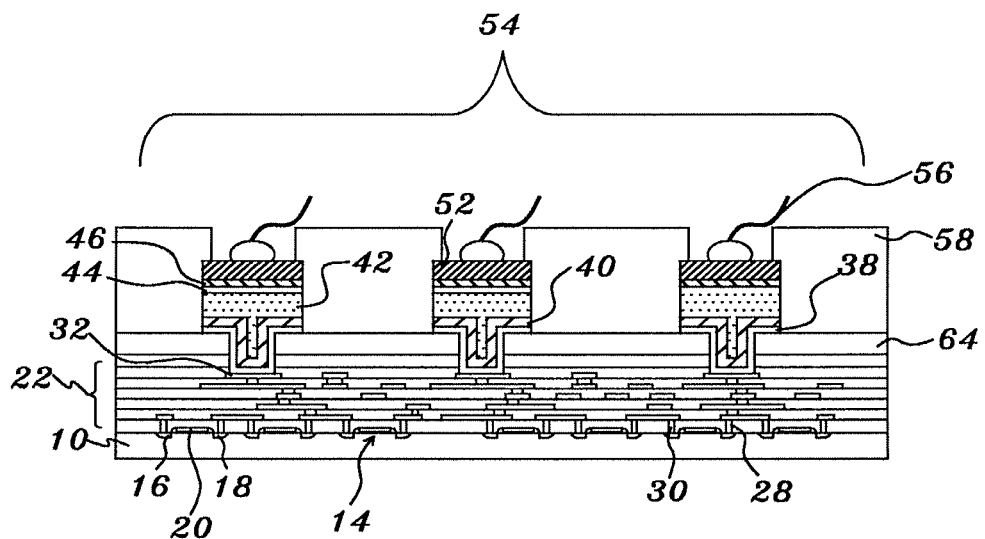
Figure 1W:
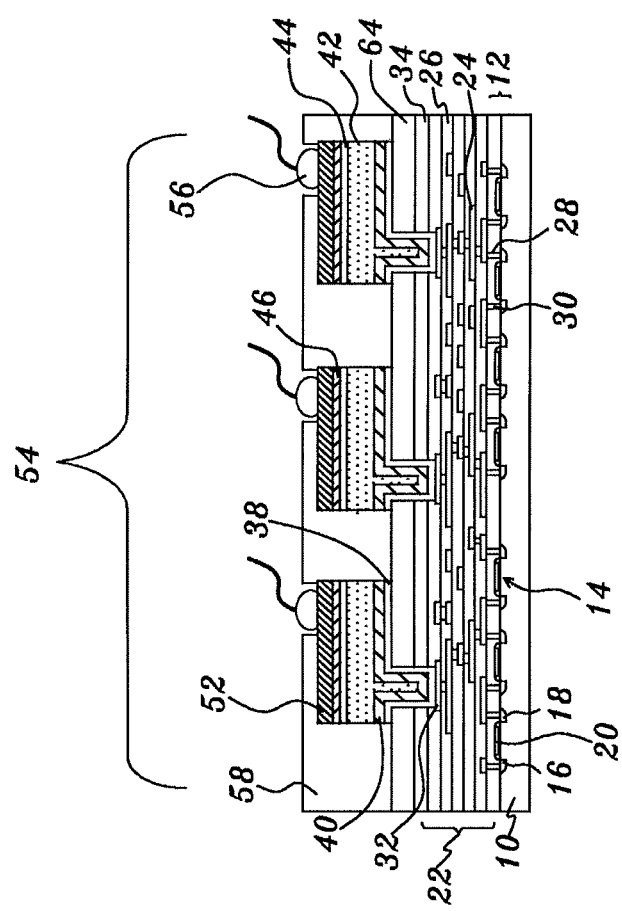

Refer to FIG. 1*u*, FIG. 1*v* and FIG. 1*w*. The structure of Aspect 4 is essentially similar to the structures of Aspect 1, Aspect 2 and Aspect 3. However, a polymer layer 64 having a thickness of between 2 and 50 μm is formed between the passivation layer 34 and the metal layer 52. The polymer layer 64 is made of the same material as the polymer layer 58 and is used to buffer the stress occurring during the wire-bonding process and protect the device layer 12 below the metal layer 52 from damage. Thus, all the aspects of Embodiment I have been totally introduced above.

Below, other embodiments are to be introduced. It is to be noted: the structures of the following embodiments, such as the substrate 10, the device layer 12, the MOS transistor 14, the source 16, the drain 18, the gate 20, the fine-line metallization structure 22, the metal pad 32, the passivation layer 34, the adhesion/barrier layer 38, the catalytic metal layer 40, the carbon nanotube layer 42, etc., are essentially similar to those of Embodiment I, and the materials and the fabrication processes of those structures are also similar to those of Embodiment I. Therefore, the introduction of the following embodiments will only describe the characteristics of the structures and technologies thereof.

Embodiment II

Aspect 1 of Embodiment II

Figure 2A:
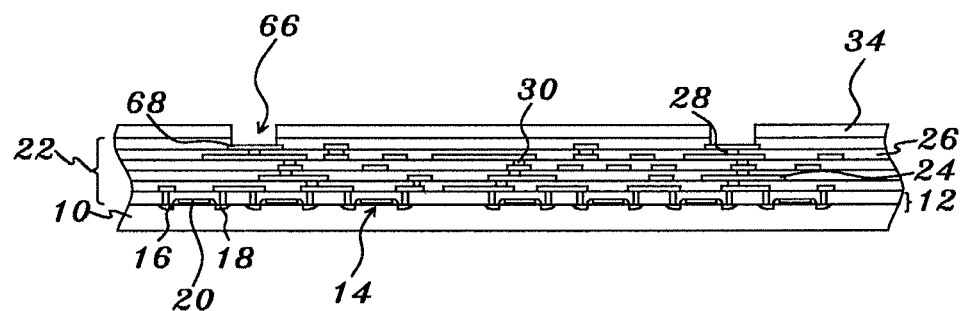
FIG. 2a to FIG. 2i are diagrams schematically showing Aspect 1 of Embodiment II of the present invention.

Refer to FIG. 2*a*. The substrate 10, the device layer 12, the fine-line metallization structure 22, and the passivation layer 34 of Embodiment II are similar to those of Embodiment I and will not be introduced again here. The characteristic of Embodiment II is that at least two openings 66 are formed in the passivation layer 34 and respectively expose two metal pads 68 of the fine-line conductivity layer 24. The opening 66 has a dimension of between 0.1 and 200 μm with a preferred dimension of between 1 and 100 μm or between 5 and 30 μm. The shape of the opening 66 may be a circle, a square, a rectangle or a polygon, and the abovementioned dimension is thus the diameter of a circle, the length of one side of a square, the width of a rectangle or the length of the greatest diagonal of a polygon. When the shape of the opening 66 is a rectangle, the dimension of the rectangle is limited to between 1 μm and 1 mm with a preferred dimension of between 5 and 200 μm.

Figure 2B:
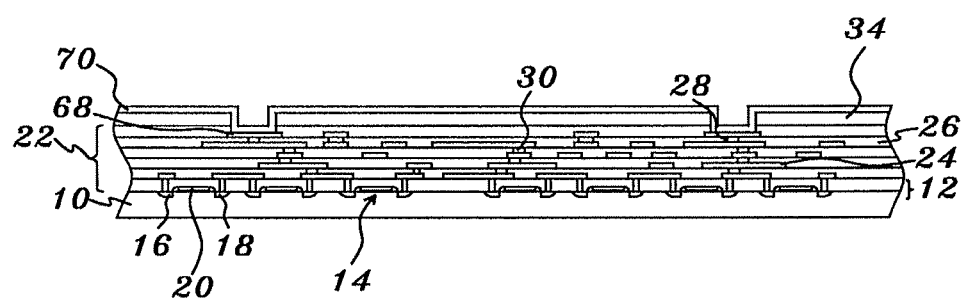
Figure 2C:
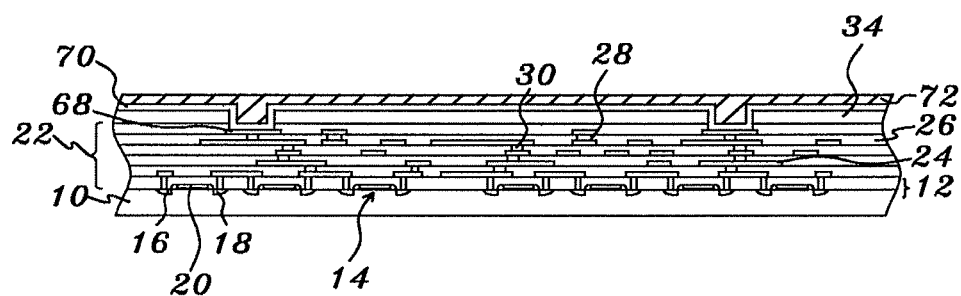
Figure 2D:
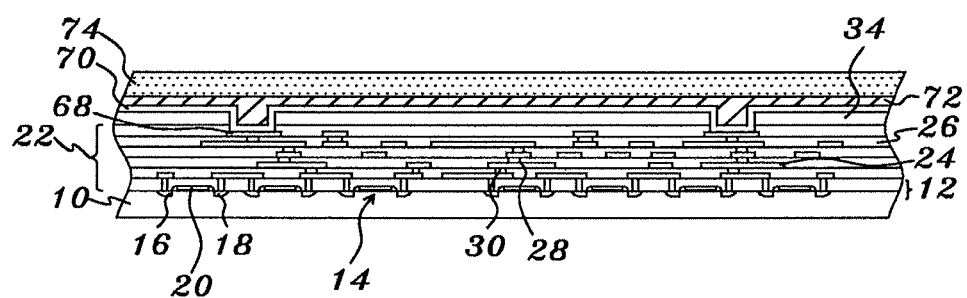
Figure 2E:
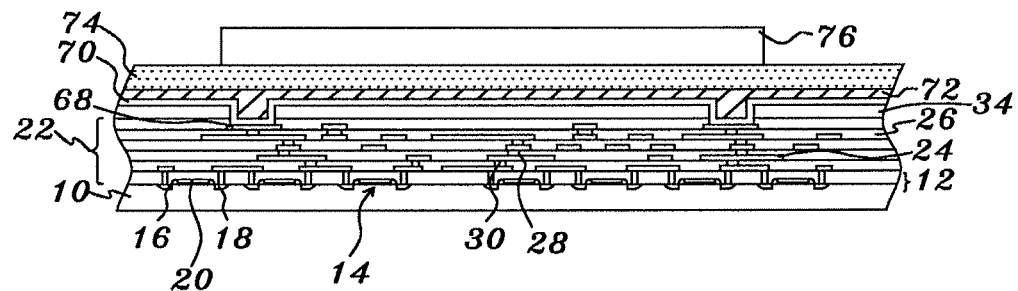
Figure 2F:
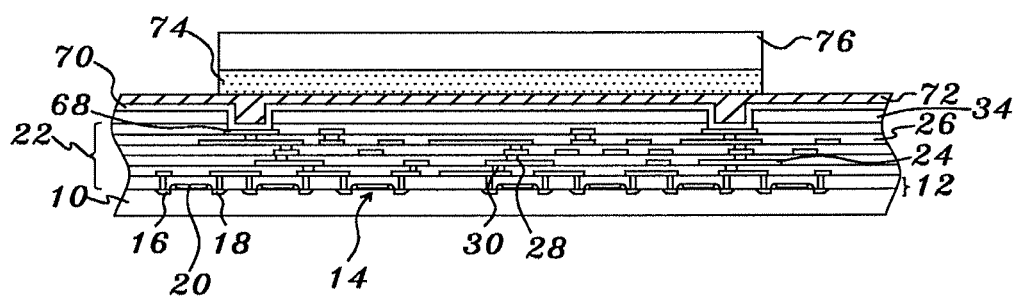
Figure 2G:
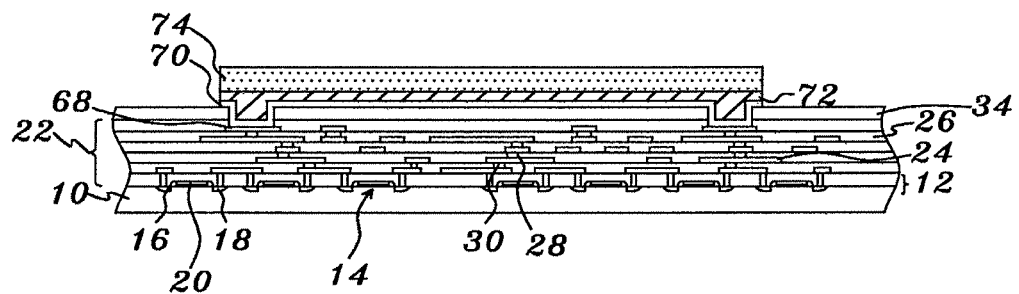
Figure 2H:
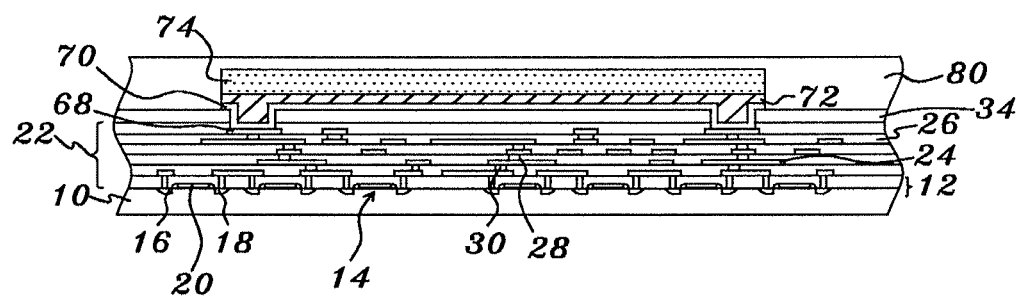
Figure 2I:
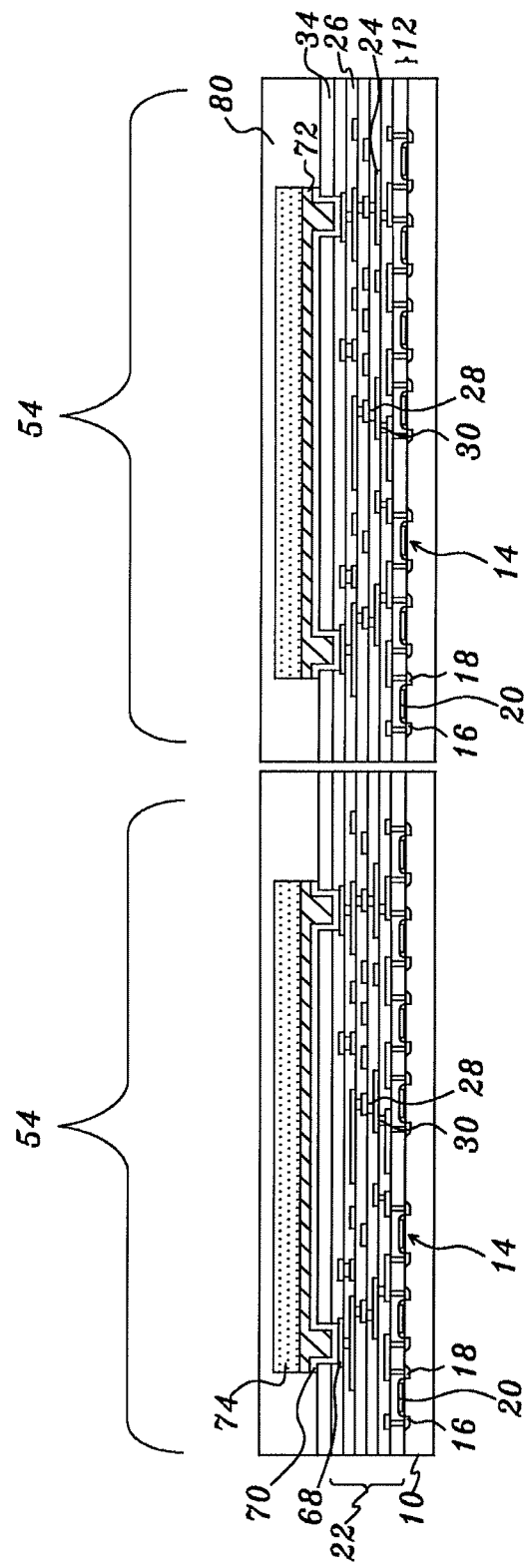

Refer to FIG. 2*b*. An adhesion/barrier layer 70 is formed over the passivation layer 34 and the metal pad 68. The adhesion/barrier layer 70 has a thickness of between 0.02 and 0.8 μm with a preferred thickness of between 0.05 and Refer to FIG. 2*c*. A catalytic metal layer 72 having a thickness of between 1 and 10 μm is formed over the adhesion/barrier layer 70. Refer to FIG. 2*d*. A carbon nanotube layer 74 having a thickness of between 100 nm and 20 μm is formed over the catalytic metal layer 72. Refer to FIG. 2*e*. A patterned photoresist layer 76 is formed over the carbon nanotube layer 74 and has a plurality of openings 78 to expose a portion of the carbon nanotube layer 74. The patterned photoresist layer 76 has a thickness of between 3 and 60 μm with a preferred thickness of between 10 and 40 μm. Refer to FIG. 2*f*. The exposed carbon nanotube layer 74 and catalytic metal layer 72 are removed with a high-pressure argon sputter-etching method. During the high-pressure argon sputter-etching process, the thickness of the patterned photoresist layer 76 will be lessened to some extent; therefore, the patterned photoresist layer 76 should have an appropriate thickness. The thickness of the patterned photoresist layer 76 is preferred to be over three times the thickness of the carbon nanotube layer 74. Refer to FIG. 2*g*. The patterned photoresist layer 76 is removed; then, the catalytic metal layer 72 and the adhesion/barrier layer 70 are removed except those below the carbon nanotube layer 74. Refer to FIG. 2*h*. A polymer layer 80 is formed over the passivation layer 34 and the carbon nanotube layer 74; then, the polymer layer 80 is cured. Refer to FIG. 2*i*. Similarly, the substrate 10 is diced into a plurality of semiconductor chips 54. In Aspect 1 of Embodiment II, the carbon nanotube layer 74 functions as an internal connection line to interconnect at least two metal pads 68. As the carbon nanotube layer 74 does not connect to external circuits but merely interconnects internal structures, it does not need any metal layer. Thus, the description of Aspect 1 of Embodiment I is completed here.

Aspect 2 of Embodiment II

Figure 2J:
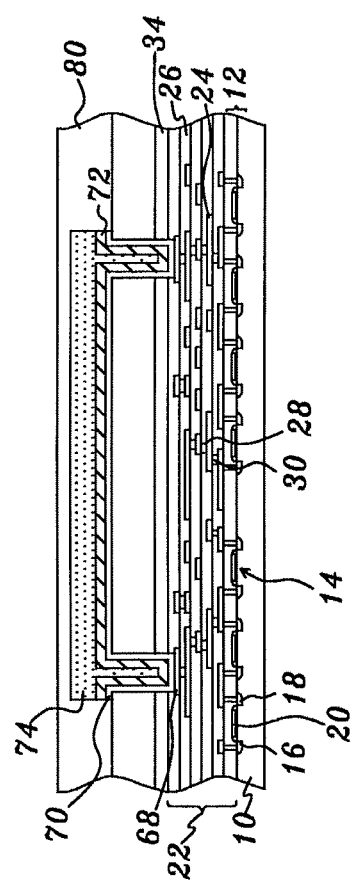
FIG. 2j is a diagram schematically showing Aspect 2 of Embodiment II of the present invention.

Refer to FIG. 2*j*. The structure of Aspect 2 of Embodiment II is essentially similar to that of Aspect 1 of Embodiment II. The characteristic of Aspect 2 of Embodiment II is that a polymer layer 82 is formed between the carbon nanotube layer 74 and the passivation layer 34 and used to separate the carbon nanotube layer 74 and the passivation layer 34. The fabrication method of the polymer layer 58 may be referred to for that of the polymer layer 82.

Aspect 3 of Embodiment II

Figure 2K:
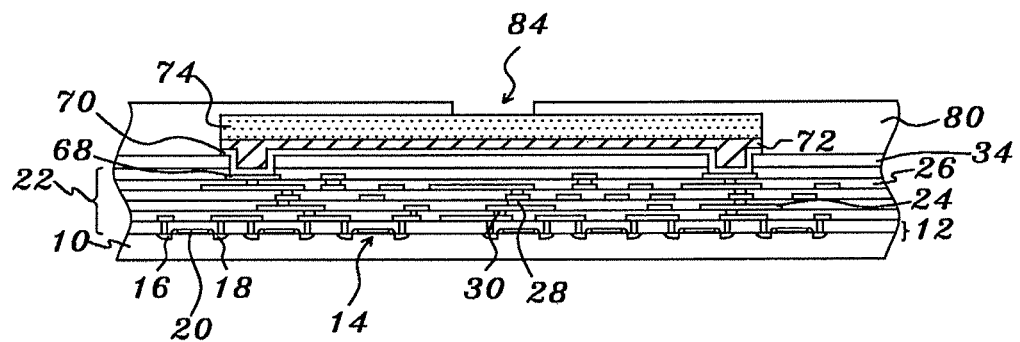
FIG. 2k to FIG. 2o are diagrams schematically showing Aspect 3 of Embodiment II of the present invention.
Figure 2L:
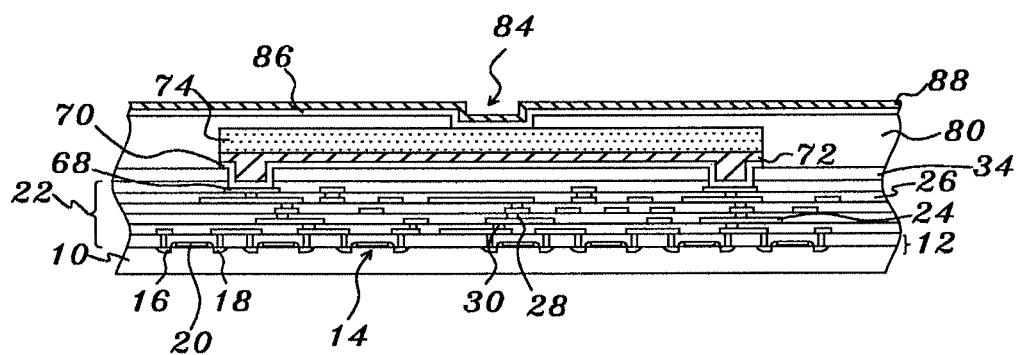
Figure 2M:
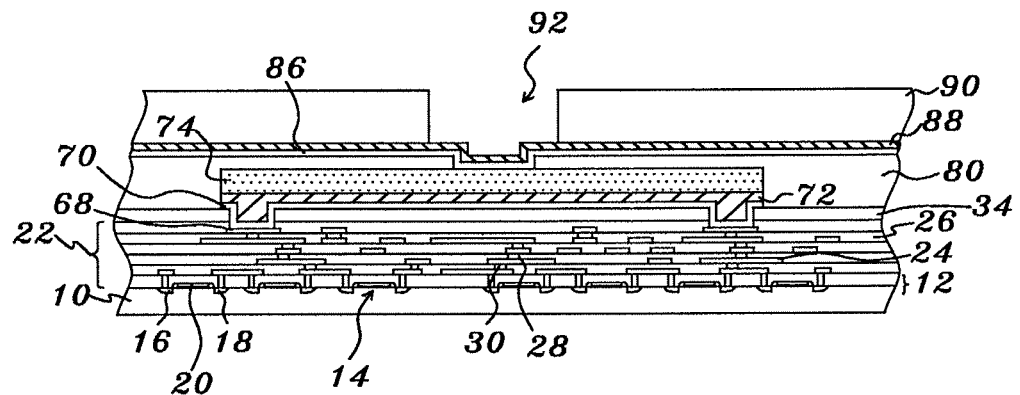
Figure 2N:
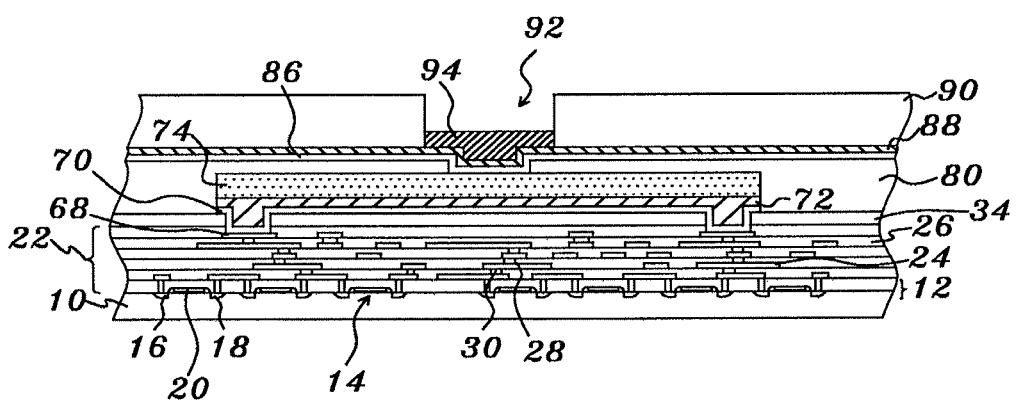
Figure 2O:
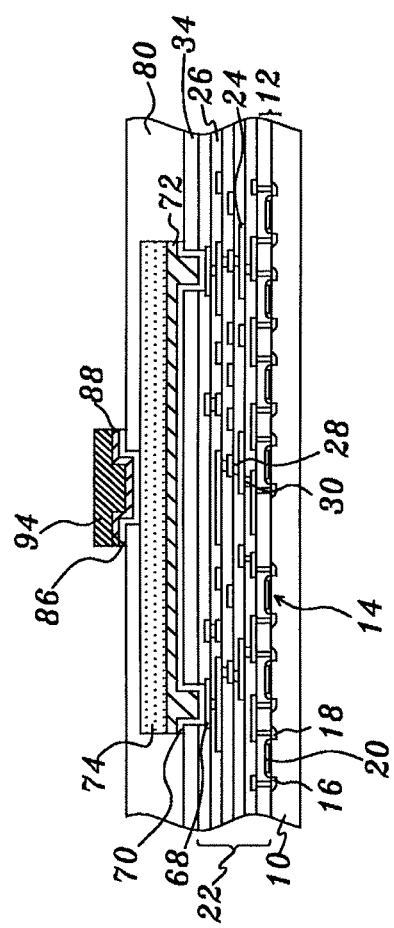

Refer to FIG. 2*k*. The structure of Aspect 3 of Embodiment II is essentially similar to that of Aspect 1 of Embodiment II. The characteristic of Aspect 3 of Embodiment II is that the polymer layer 80 has at least one opening 84 to expose the carbon nanotube layer 74. In fact, the fabrication process of Aspect 3 of Embodiment II succeeds to the process shown in FIG. 2h. Next, the polymer layer 80 is cured similarly. Refer to FIG. 2L. An adhesion/barrier layer 86 and a seed layer 88 is sequentially formed over the polymer layer 80 and the exposed carbon nanotube layer 74. Refer to FIG. 2m. A patterned photoresist layer 90 is formed over the seed layer 88, and the patterned photoresist layer 90 has a plurality of openings 92 to expose the seed layer 88. Refer to FIG. 2n. A metal layer 94 having a thickness of between 1 and 30 μm is formed on the surface of the seed layer 88 inside the openings 92. Refer to FIG. 2o. The patterned photoresist layer 90 is removed, and the seed layer 88 and the adhesion/barrier layer 86 are also removed except those below the metal layer 94. Then, wires (not shown in the drawings) are bonded to the metal layer 94 with a wire-bonding process, and the semiconductor chips can thus be connected to external circuits.

Embodiment III

Aspect 1 of Embodiment III

Figure 3A:
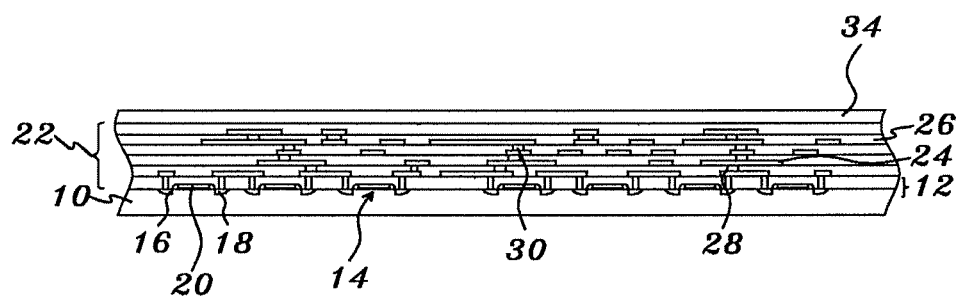
FIG. 3a to FIG. 3k are diagrams schematically showing Aspect 1 of Embodiment III of the present invention.

Refer to FIG. 3a. The substrate 10, the device layer 12, and the passivation layer 34 are similar to those of Embodiment I. The similar portion of the fine-line metallization structure 22 will not be introduced again here. The characteristic of Aspect 1 of Embodiment III is that the passivation layer 34 has none opening to expose the metal pad 32.

Figure 3B:
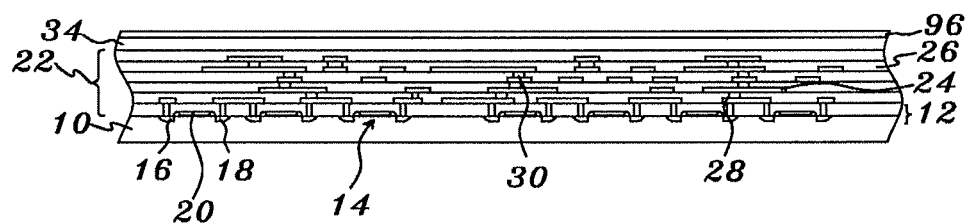
Figure 3C:
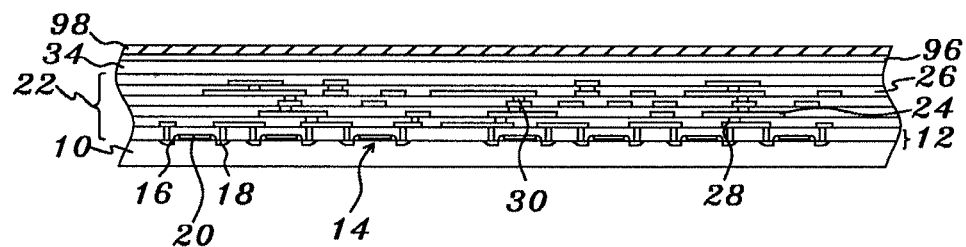
Figure 3D:
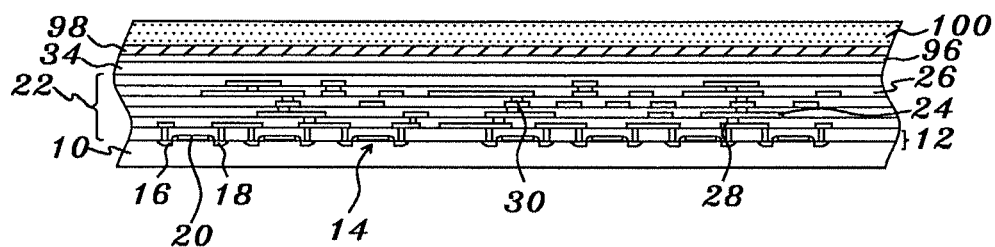
Figure 3E:
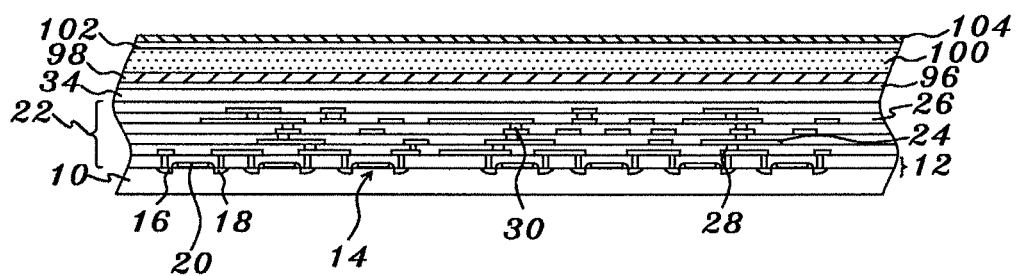
Figure 3F:
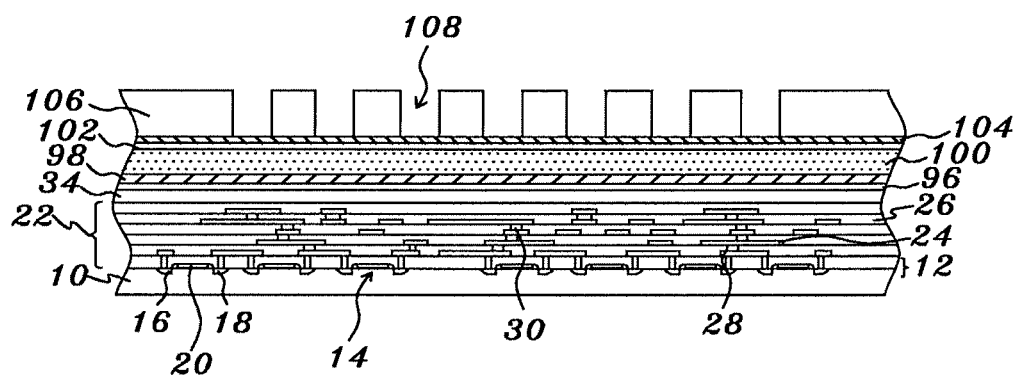
Figure 3G:
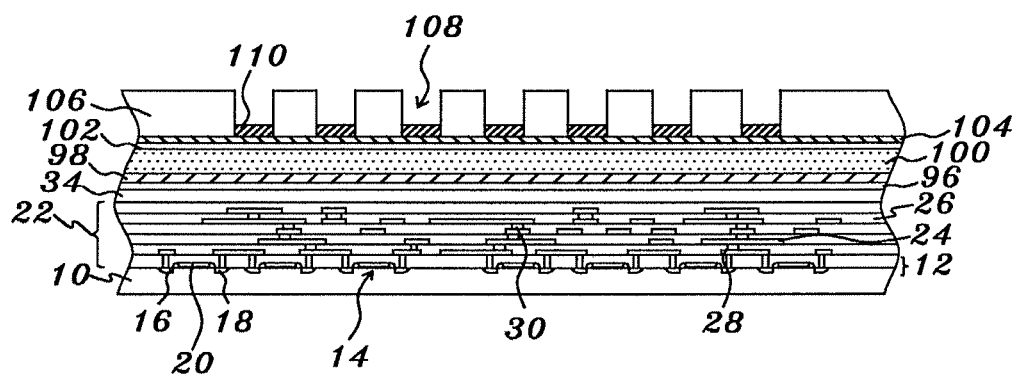
Figure 3H:
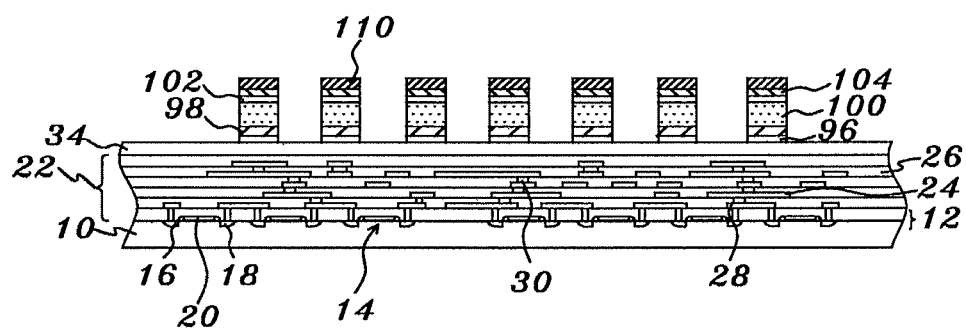
Figure 3I:
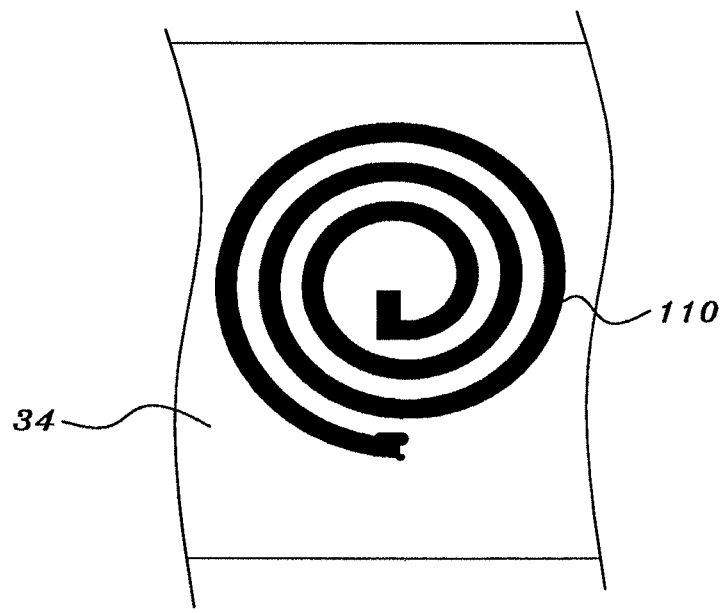
Figure 3J:
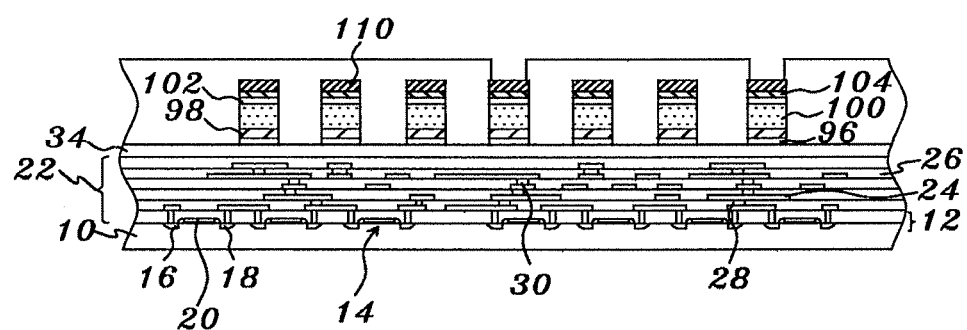
Figure 3K:
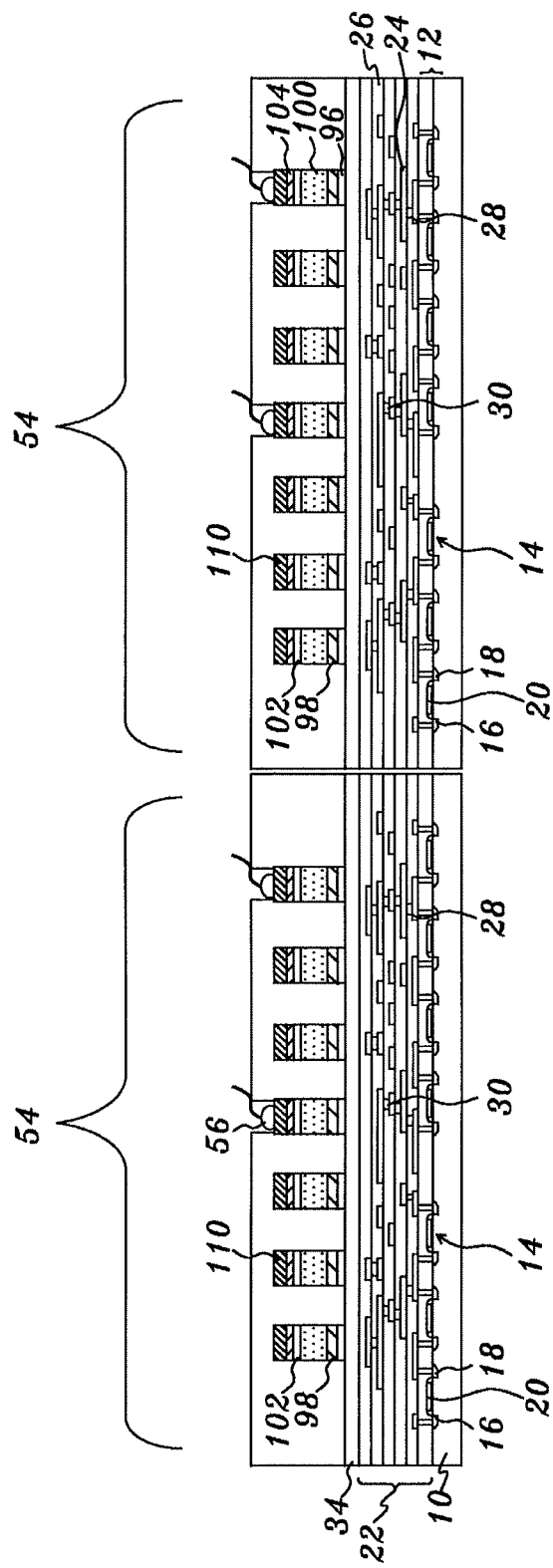

Refer to FIG. 3b. An adhesion/barrier layer 96 is formed over the passivation layer 34 and has a thickness of between 0.02 and 0.8 μm with a preferred thickness of between 0.05 and 0.2 μm. Refer to FIG. 3c. A catalytic metal layer 98 having a thickness of between 1 and 10 μM is formed over the adhesion/barrier layer 96. Refer to FIG. 3d. A carbon nanotube layer 100 having a thickness of between 100 nm and 20 μm is formed over the catalytic metal layer 98. Refer to FIG. 3e. An adhesion/barrier layer 102 having a thickness of between 0.02 and 0.8 μm and a seed layer 104 are formed over the carbon nanotube layer 100. Refer to FIG. 3f. A patterned photoresist layer 106 is formed over the seed layer 104, and the patterned photoresist layer 106 has at least one coil-shape opening 108 to expose a portion of the surface of the seed layer 104. The patterned photoresist layer 106 has a thickness of between 3 and 60 μm with a preferred thickness of between 5 and 40 μm. Refer to FIG. 3g. A metal layer 110 having a thickness of between 1 and 30 μm is electroplated on the surface of the seed layer 104 inside the openings 108. Refer to FIG. 3h. The patterned photoresist layer 106 is removed. The seed layer 104, the adhesion/barrier layer 102, the carbon nanotube layer 100, the catalytic metal layer 98 and the adhesion/barrier layer 96 are also removed except those below the metal layer 110. Refer to FIG. 3i. The metal layer 110 has a coil-like shape and functions as an inductor element. Refer to FIG. 3j. A patterned polymer layer 112 is formed over the metal layer 110 and the passivation layer 34, and the patterned polymer layer 112 has a least one opening 114 to expose the surface of the metal layer 110. In this embodiment, the patterned polymer layer 112 has two openings 114 to expose the metal layer 110. Then, the patterned polymer layer 112 is cured. Refer to FIG. 3k. The substrate 10 is diced into a plurality of semiconductor chips 54. With a wire-bonding process, a wire 56, via which the chip 54 is connected to an external circuit, is bonded to the surface of the metal layer 110 inside the opening 114.

Aspect 2 of Embodiment III

Figure 3L:
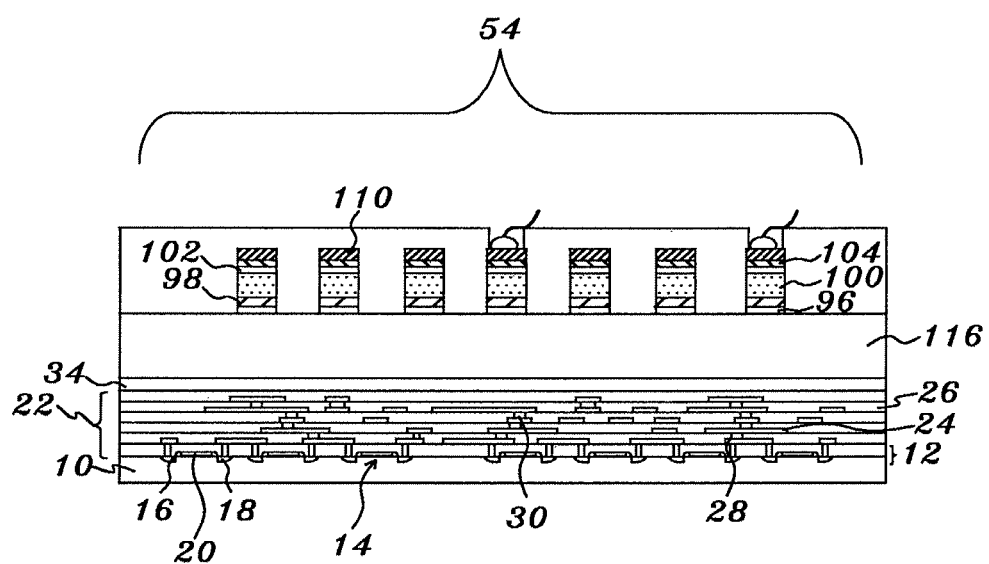
FIG. 3L is a diagram schematically showing Aspect 2 of Embodiment III of the present invention.

Refer to FIG. 3L. Aspect 2 of Embodiment III is essentially similar to Aspect 1 of Embodiment III. The characteristic of Aspect 2 of Embodiment III is that a polymer layer 116 is formed over the passivation layer 34 before the step of forming the adhesion/barrier layer 96. In other words, the polymer layer 116 is interposed between the adhesion/barrier layer 96 and the passivation layer 34. After the polymer layer 116 is cured, the succeeding process is similar to that of Aspect 1 of Embodiment III; the adhesion/barrier layer 96, the catalytic metal layer 98, the carbon nanotube layer 100, the adhesion/barrier layer 102, the seed layer 104, the patterned photoresist layer 106, the metal layer 110, the patterned polymer layer 112, and the wire 56 are sequentially formed. The polymer layer 116 is used to enlarge the distance between the coil-like carbon nanotube layer 100 and the fine-line metallization structure 22. The carbon nanotube layer 100 is connected to an external circuit via the wire 56. When a current flows through the coil-like carbon nanotube layer 100, an induced electromotive force is generated. The fine-line conductivity layer 24 below the passivation layer 34 is thus induced, and the coil-like carbon nanotube layer 100 will have massive static charge amounting to about 1500V. Therefore, the polymer layer 116 should have an appropriate thickness to separate the coil-like carbon nanotube layer 100 and the fine-line conductivity layer 24 and prevent the fine-line conductivity layer 24 from being damaged.

Embodiment IV

Aspect 1 of Embodiment IV

Figure 4A:
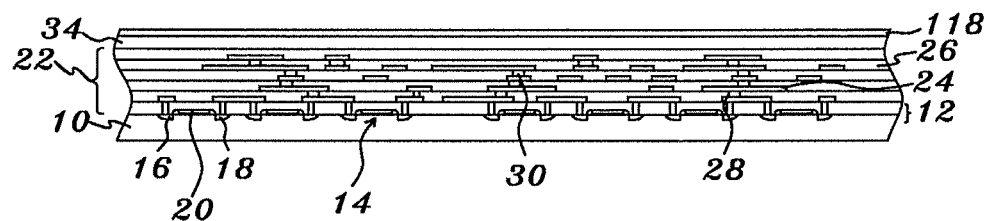
Figure 4B:
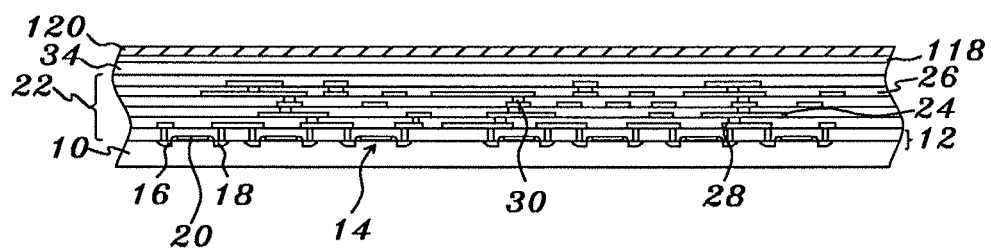
Figure 4C:
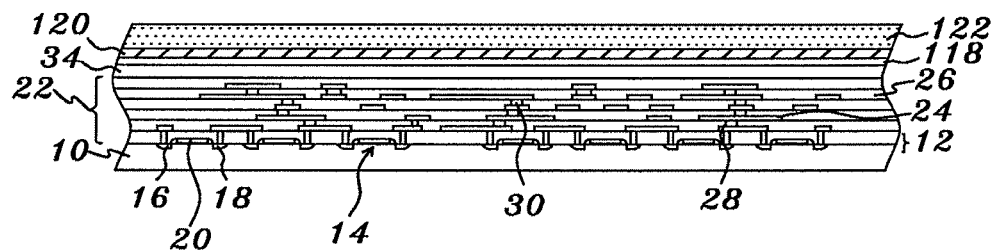
Figure 4D:
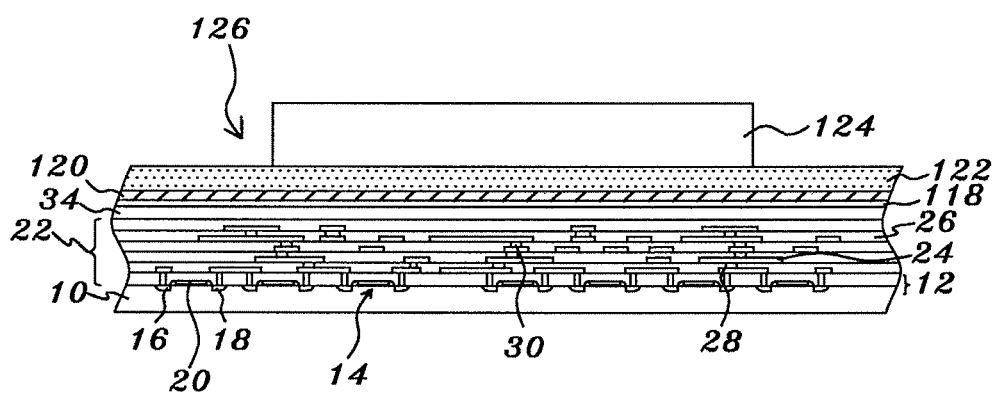
Figure 4E:
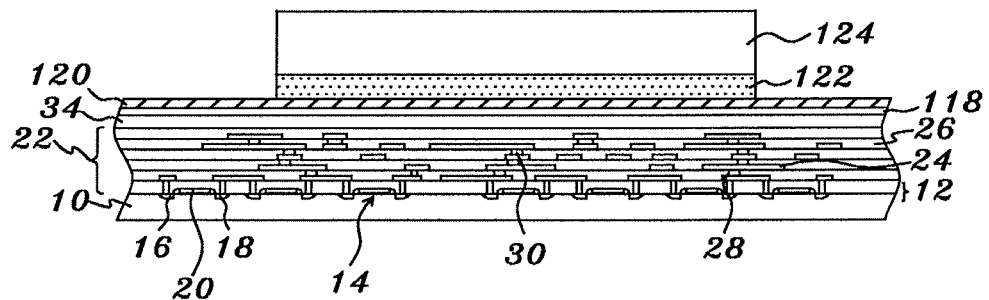
Figure 4F:
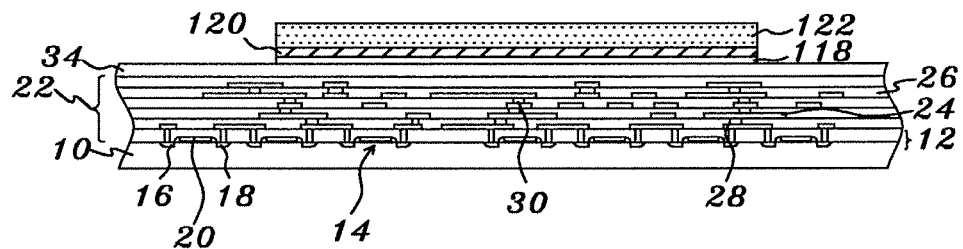

Aspect 1 of Embodiment IV is essentially similar to Aspect 1 of Embodiment III. Refer to FIG. 4a. The process shown in FIG. 4a succeeds to the process shown in FIG. 3a. An adhesion/barrier layer 118 is formed over the passivation layer 34 and has a thickness of between 0.02 and 0.8 μm with a preferred thickness of between 0.05 and 0.2 μm. Refer to FIG. 4b. A catalytic metal layer 120 having a thickness of between 1 and 10 μm is formed over the adhesion/barrier layer 118. Refer to FIG. 4c. A carbon nanotube layer 122 having a thickness of between 100 nm and 20 μm is formed over the catalytic metal layer 120, and the carbon nanotube layer 122 is made of non-conductive carbon nanotubes. Refer to FIG. 4d. A patterned photoresist layer 124 is formed over the carbon nanotube layer 122 and has a plurality of openings 126 to expose a portion of the carbon nanotube layer 122. The patterned photoresist layer 124 has a thickness of between 3 and 60 μm with a preferred thickness of between 10 and 40 μm. Refer to FIG. 4e. The exposed carbon nanotube layer 122 and catalytic metal layer 120 are removed with a high-pressure argon sputter-etching method. During the high-pressure argon sputter-etching process, the thickness of the patterned photoresist layer 124 will be lessened to some extent; therefore, the patterned photoresist layer 124 should have an appropriate thickness. The thickness of the patterned photoresist layer 124 is preferred to be over three times the thickness of the carbon nanotube layer 122. Refer to FIG. 4f. The patterned photoresist layer 124 is removed, and the adhesion/barrier layer 118 is also removed except that below the carbon nanotube layer 122. At this time, the carbon nanotube layer 122 is a plane. From a top view, the shape of the carbon nanotube layer 122 may be a circle, a rectangle, or another shape. Refer to FIG. 4g. Similarly, the substrate 10 is diced into a plurality of semiconductor chips 54. In Aspect 1 of Embodiment IV, each semiconductor chip 54 has one carbon nanotube layer 122 functioning as a radiator. Via the superior thermal conductivity of carbon nanotubes, the heat generated by the operating chip 54 can be fast removed.

Aspect 2 of Embodiment IV

Figure 4H:
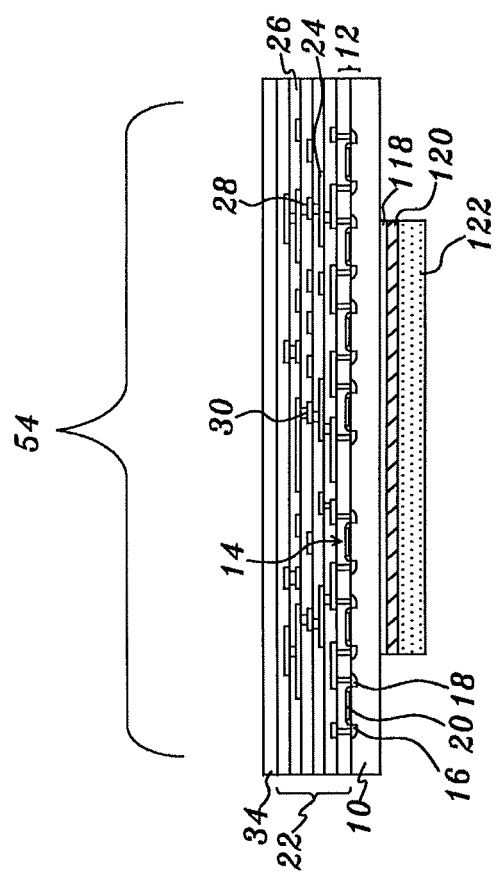
FIG. 4h is a diagram schematically showing Aspect 2 of Embodiment IV of the present invention.

Refer to FIG. 4h. The structure of Aspect 2 of Embodiment IV is essentially similar to that of Aspect 1 of Embodiment IV. In Aspect 1 of Embodiment IV, the carbon nanotube layer 122 is formed on the passivation layer and above the active plane of the substrate 10. However, in Aspect 2 of Embodiment IV, the carbon nanotube layer 122 is formed on the non-active plane of the substrate 10, which not only can prevent the passivation layer 34 from being damaged during the fabrication process of the carbon nanotube layer 122 but also can save the space above the passivation layer 34. Thus, the redistribution layer (RDL), the interconnection line, the inductor element and the bump, which are made of metals, can be formed over the passivation layer 34 with an electroplating process. Alternatively, the redistribution layer (RDL), the interconnection line, the inductor element and the bump, which are made of carbon nanotubes, can be formed over the passivation layer 34, like those in Embodiment I, Embodiment II, or Embodiment III. The technical description thereof will not repeat here.

In summary, the present invention utilizes carbon nanotubes to form the over-passivation scheme and the heat-dissipating structure. The circuit of the semiconductor element can thus be made finer and denser via the electric conductivity, flexibility and strength of the carbon nanotube. Further, the heat dissipation capability of the semiconductor can thus be improved via the superior thermal conductivity of the carbon nanotube.

Those described above are the embodiments to exemplify the present invention to enable the persons skilled in the art to understand, make and use the present invention. However, it is not intended to limit the scope of the present invention. Any equivalent modification and variation according to the spirit of the present invention is to be also included within the scope of the present invention.

What is claimed is:

1. A semiconductor chip comprising:
   a semiconductor substrate;
   a conductive layer on said semiconductor substrate;
   a passivation layer on said conductive layer, wherein a first opening in said passivation layer exposes a first contact point of said conductive layer, the passivation layer having a surface opposite said semiconductor substrate and opposing sidewalls at the first opening, wherein said passivation layer comprises an insulating material, and wherein said first contact point is on a surface of the conductive layer opposite the semiconductor substrate;
   a conductive interconnect on the opposing sidewalls and the surface of the passivation layer; and
   a carbon-nanotube structure on said conductive interconnect, wherein said carbon-nanotube-structure is external to the semiconductor chip and coupled to said first contact point through said first opening.

2. The semiconductor chip of claim 1, wherein a second opening in said passivation layer exposes a second contact point of said conductive layer, wherein said carbon-nanotube structure is coupled to said second contact point through said second opening, wherein said first contact point is coupled to said second contact point through said carbon-nanotube structure.

3. The semiconductor chip of claim 1, wherein said insulating material comprises a nitride having a thickness between 0.2 and 1.5 micrometers.

4. The semiconductor chip of claim 1, wherein said conductive layer comprises a copper layer.

5. The semiconductor chip of claim 1 further comprising a conductive contact on said carbon-nanotube structure, wherein said conductive contact is electrically coupled to said carbon-nanotube structure.

6. The semiconductor chip of claim 1 further comprising a polymer layer on said passivation layer, wherein said carbon-nanotube structure is further on said polymer layer.

7. The semiconductor chip of claim 1, wherein said carbon-nanotube structure has a length greater than a height of said carbon-nanotube structure.

8. A semiconductor chip comprising:
   a semiconductor substrate;
   a first conductive layer on said semiconductor substrate;
   a second conductive layer on said semiconductor substrate and said first conductive layer;
   a dielectric layer between said first and second conductive layers;
   a passivation layer on said first conductive layer, a first opening in said passivation layer exposes a first contact point of said first conductive layer, the passivation layer having a surface opposite said semiconductor substrate and opposing sidewalls at the first opening, wherein said passivation layer comprises an insulating material, and wherein said passivation layer is on a surface of the first conductive layer opposite the semiconductor substrate;
   a conductive interconnect on the sidewalls and the surface of the passivation layer; and
   a carbon-nanotube structure external to the semiconductor chip and on said conductive interconnect.

9. The semiconductor chip of claim 8, wherein said first conductive layer comprises a copper layer.

10. The semiconductor chip of claim 8, wherein said insulating material comprises a nitride having a thickness between 0.2 and 1.5 micrometers.

11. The semiconductor chip of claim 8 further comprising a polymer layer on said carbon-nanotube structure.

12. The semiconductor chip of claim 8, wherein a portion of a surface of said carbon-nanotube structure is accessible for external connection.

13. A method of forming a semiconductor chip, comprising:
   providing a semiconductor substrate, a conductive layer on said semiconductor substrate, and a passivation layer on said conductive layer, wherein said passivation layer comprises an insulating material, and wherein an opening in said passivation layer exposes a contact point of said conductive layer, said passivation layer having a surface opposite said semiconductor substrate and opposing sidewalls at the opening;
   forming a conductive interconnect on the opposing sidewalls and the surface of the passivation layer; and
   forming a carbon-nanotube structure on said conductive interconnect, wherein said carbon-nanotube structure is external to the semiconductor chip and coupled to said contact point through said opening.

14. The method of claim 13, wherein said providing said conductive layer comprises a damascene process, wherein said conductive layer comprises copper.

15. The method of claim 13, wherein said insulating material comprises a nitride having a thickness between 0.2 and 1.5 micrometers.

16. The method of claim 13 further comprising forming a polymer layer on said carbon-nanotube structure.

17. The method of claim 13 further comprising forming a polymer layer on said passivation layer, followed by said forming said carbon-nanotube structure on said polymer layer.

* * * * *